US010032519B2

(12) United States Patent
Kato

(10) Patent No.: US 10,032,519 B2
(45) Date of Patent: Jul. 24, 2018

(54) SEMICONDUCTOR MEMORY DEVICE IN WHICH BIT LINE PRE-CHARGING, WHICH IS BASED ON RESULT OF VERIFY OPERATION, IS INITIATED PRIOR TO COMPLETION OF THE VERIFY OPERATION

(71) Applicant: Toshiba Memory Corporation, Tokyo (JP)

(72) Inventor: Koji Kato, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/447,117

(22) Filed: Mar. 2, 2017

(65) Prior Publication Data
US 2018/0068738 A1 Mar. 8, 2018

(30) Foreign Application Priority Data
Sep. 7, 2016 (JP) .................................. 2016-174636

(51) Int. Cl.
| G11C 16/06 | (2006.01) |
| G11C 16/34 | (2006.01) |
| G11C 16/10 | (2006.01) |
| G11C 16/08 | (2006.01) |
| G11C 16/24 | (2006.01) |
| G11C 16/26 | (2006.01) |
| G11C 16/04 | (2006.01) |

(52) U.S. Cl.
CPC ...... *G11C 16/3459* (2013.01); *G11C 16/0483* (2013.01); *G11C 16/08* (2013.01); *G11C 16/10* (2013.01); *G11C 16/24* (2013.01); *G11C 16/26* (2013.01)

(58) Field of Classification Search
CPC . G11C 16/3459; G11C 16/0483; G11C 16/26; G11C 16/08; G11C 16/10; G11C 16/24
USPC ............. 365/185.22, 185.21, 185.19, 185.25
See application file for complete search history.

(56) References Cited

U.S. PATENT DOCUMENTS

| 7,986,573 B2* | 7/2011 | Li .................. G11C 11/5628 365/185.11 |
| 8,089,815 B2* | 1/2012 | Li .................. G11C 11/5628 365/185.17 |
| 8,551,838 B2 | 10/2013 | Kito et al. |

\* cited by examiner

*Primary Examiner* — David Lam
(74) *Attorney, Agent, or Firm* — Patterson & Sheridan, LLP

(57) ABSTRACT

A semiconductor memory device includes a memory cell, a bit line electrically connected to the memory cell, a sense amplifier electrically connected to the bit line and including a first latch, and a controller configured to execute a write operation on the memory cell. The write operation includes a first program operation followed by a verify operation that includes a step of updating data of the first latch and a second program operation that includes a step of pre-charging the bit line, wherein the step of pre-charging the bit line is initiated prior to the data of the first latch is updated.

17 Claims, 25 Drawing Sheets

FIG. 8

TABLE (A)
STORE INVERTED DATA OF XDL IN ADL,
AND STORE INVERTED DATA OF ADL IN SDL

| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 1 | 1 | ... | 0 | 1 | 1 | ... | 0 | XDL→/ADL |
| SDLi | 1 | 0 | 0 | 0 | ... | 1 | 0 | 0 | ... | 1 | ADL→/SDL |

⇩ PERFORM PROGRAMMING

TABLE (B)
SET "1" IN SDL

| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 1 | 1 | ... | 0 | 1 | 1 | ... | 0 | |
| SDLi | 1 | 1 | 1 | 1 | ... | 1 | 1 | 1 | ... | 1 | All "1" |

⇩ START VERIFICATION

TABLE (C)
AS RESULT OF STROBING, UPDATE ALD

| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | off cell; "1"→"0" |
| SDLi | 1 | 1 | 1 | 1 | ... | 1 | 1 | 1 | ... | 1 | |

⇩ • START BL CHARGING AND
    BL DISCHARGING
  • START SCANNING

FIG. 9
(D_0) Scan<0>
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | |
| SDLi | 1 | 1 | 1 | 1 | ... | 1 | 0 | 1 | ... | 1 | ADL<0>→/SDL<0> |
Fail
(D_1) Scan<1>
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | |
| SDLi | 1 | 0 | 1 | 1 | ... | 1 | 0 | 1 | ... | 1 | ADL<1>→/SDL<1> |
Fail           Pass
(D_2) Scan<2>
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | |
| SDLi | 1 | 0 | 1 | 1 | ... | 1 | 0 | 1 | ... | 1 | ADL<2>→/SDL<2> |
Pass
(D_3) Scan<3>
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | |
| SDLi | 1 | 0 | 1 | 0 | ... | 1 | 0 | 1 | ... | 1 | ADL<3>→/SDL<3> |
Fail
:
(D_7) Scan<7>
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 1 | 0 | 1 | ... | 0 | 1 | 0 | ... | 0 | |
| SDLi | 1 | 0 | 1 | 0 | ... | 1 | 0 | 1 | ... | 1 | ADL<7>→/SDL<7> |
 PERFORM NEXT PROGRAMMING

FIG. 14

TABLE (A)
STORE INVERTED DATA OF XDL IN ADL,
AND STORE INVERTED DATA OF ADL IN SDL

| IO   | 0 | 1 | 2 | 3 | ... | 7 | 0 | 1 | ... | 7   |           |
|------|---|---|---|---|-----|---|---|---|-----|-----|-----------|
| i    | 0 | 1 | 2 | 3 | ... | 7 | 8 | 9 | ... | N-1 |           |
| ADLi | 0 | 1 | 1 | 1 | ... | 0 | 1 | 1 | ... | 0   | XDL→/ADL  |
| SDLi | 1 | 0 | 0 | 0 | ... | 1 | 0 | 0 | ... | 1   | ADL→/SDL  |

⇩ PERFORM PROGRAMMING

TABLE (B)
SET "1" IN SDL

| IO   | 0 | 1 | 2 | 3 | ... | 7 | 0 | 1 | ... | 7   |         |
|------|---|---|---|---|-----|---|---|---|-----|-----|---------|
| i    | 0 | 1 | 2 | 3 | ... | 7 | 8 | 9 | ... | N-1 |         |
| ADLi | 0 | 1 | 1 | 1 | ... | 0 | 1 | 1 | ... | 0   |         |
| SDLi | 1 | 1 | 1 | 1 | ... | 1 | 1 | 1 | ... | 1   | All "1" |

⇩ START VERIFICATION

TABLE (C)
AS RESULT OF STROBING, UPDATE ALD AND SET "0" IN SDL

| IO   | 0 | 1 | 2 | 3 | ... | 7 | 0 | 1 | ... | 7   |                    |
|------|---|---|---|---|-----|---|---|---|-----|-----|--------------------|
| i    | 0 | 1 | 2 | 3 | ... | 7 | 8 | 9 | ... | N-1 |                    |
| ADLi | 0 | 0 | 0 | 1 | ... | 0 | 0 | 1 | ... | 0   | off cell: "1"→"0"  |
| SDLi | 0 | 0 | 0 | 0 | ... | 0 | 0 | 0 | ... | 0   | All "0"            |

⇩ • START BL CHARGING AND BL DISCHARGING
  • START SCANNING

FIG. 15
(D_0) Scan⟨0⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 0 | 1 | ... | 0 | 0 | 1 | ... | 0 | |
| SDLi | //1// | 0 | 0 | 0 | ... | 0 | //1// | 0 | ... | 0 | ADL⟨0⟩→/SDL⟨0⟩ |
Pass 
(D_1) Scan⟨1⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 0 | 1 | ... | 0 | 0 | 1 | ... | 0 | |
| SDLi | 1 | //1// | 0 | 0 | ... | 0 | 1 | //0// | ... | 0 | ADL⟨1⟩→/SDL⟨1⟩ |
Pass     Fail 
(D_2) Scan⟨2⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 0 | 1 | ... | 0 | 0 | 1 | ... | 0 | |
| SDLi | 1 | 1 | //1// | 0 | ... | 0 | 1 | 0 | ... | 0 | ADL⟨2⟩→/SDL⟨2⟩ |
Pass 
(D_3) Scan⟨3⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 0 | 1 | ... | 0 | 0 | 1 | ... | 0 | |
| SDLi | 1 | 1 | 1 | //0// | ... | 0 | 1 | 0 | ... | 0 | ADL⟨3⟩→/SDL⟨3⟩ |
Fail 
⋮
(D_7) Scan⟨7⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 0 | 1 | ... | 0 | 0 | 1 | ... | 0 | |
| SDLi | 1 | 1 | 1 | 0 | ... | //1// | 1 | 0 | ... | //1// | ADL⟨7⟩→/SDL⟨7⟩ |
 PERFORM NEXT PROGRAMMING

FIG. 22

TABLE (A)
STORE INVERTED DATA OF XDL IN ADL AND BDL,
AND STORE INVERTED DATA OF ADL IN SDL

| IO | 0 | 1 | 2 | 3 | ... | 7 | 0 | 1 | ... | 7 | |
|----|---|---|---|---|-----|---|---|---|-----|---|---|
| i  | 0 | 1 | 2 | 3 | ... | 7 | 8 | 9 | ... | N-1 | |
| ADLi | 0 | 1 | 1 | 1 | ... | 0 | 1 | 1 | ... | 0 | XDL→/ADL |
| BDLi | 0 | 1 | 1 | 1 | ... | 0 | 1 | 1 | ... | 0 | ADL→BDL |
| SDLi | 1 | 0 | 0 | 0 | ... | 1 | 0 | 0 | ... | 1 | ADL→/SDL |

⇩ PERFORM PROGRAMMING

TABLE (B)
SET "1" IN SDL

| IO | 0 | 1 | 2 | 3 | ... | 7 | 0 | 1 | ... | 7 | |
|----|---|---|---|---|-----|---|---|---|-----|---|---|
| i  | 0 | 1 | 2 | 3 | ... | 7 | 8 | 9 | ... | N-1 | |
| ADLi | 0 | 1 | 1 | 1 | ... | 0 | 1 | 1 | ... | 0 | |
| BDLi | 0 | 1 | 1 | 1 | ... | 0 | 1 | 1 | ... | 0 | |
| SDLi | 1 | 1 | 1 | 1 | ... | 1 | 1 | 1 | ... | 1 | All "1" |

⇩ START FIRST VERIFICATION

TABLE (C)
AS RESULT OF FIRST STROBING, UPDATE BDL

| IO | 0 | 1 | 2 | 3 | ... | 7 | 0 | 1 | ... | 7 | |
|----|---|---|---|---|-----|---|---|---|-----|---|---|
| i  | 0 | 1 | 2 | 3 | ... | 7 | 8 | 9 | ... | N-1 | |
| ADLi | 0 | 1 | 1 | 1 | ... | 0 | 1 | 1 | ... | 0 | |
| BDLi | 0 | 0 | 0 | 1 | ... | 0 | 0 | 1 | ... | 0 | off cell: "1"→"0" |
| SDLi | 1 | 1 | 1 | 1 | ... | 1 | 1 | 1 | ... | 1 | |

⇩ START SECOND VERIFICATION

TABLE (D)
AS RESULT OF SECOND STROBING, UPDATE ADL AND SET "0" IN SDL

| IO | 0 | 1 | 2 | 3 | ... | 7 | 0 | 1 | ... | 7 | |
|----|---|---|---|---|-----|---|---|---|-----|---|---|
| i  | 0 | 1 | 2 | 3 | ... | 7 | 8 | 9 | ... | N-1 | |
| ADLi | 0 | 0 | 1 | 1 | ... | 0 | 1 | 1 | ... | 0 | off cell: "1"→"0" |
| BDLi | 0 | 0 | 0 | 1 | ... | 0 | 0 | 1 | ... | 0 | |
| SDLi | 0 | 0 | 0 | 0 | ... | 0 | 0 | 0 | ... | 0 | All "0" |

⇩ • START BL CHARGING AND BL DISCHARGING
   • START SCANNING

FIG. 23
(E_0) Scan⟨0⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 0 | 0 | 0 | ... | 0 | 0 | 0 | ... | 0 | ADL⟨0⟩→/SDL⟨0⟩ |
QPW 
(E_1) Scan⟨1⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 1 | 0 | 0 | ... | 0 | 0 | 0 | ... | 0 | ADL⟨1⟩→/SDL⟨1⟩ |
Pass      Fail 
(E_2) Scan⟨2⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 1 | 0 | 0 | ... | 0 | 0 | 0 | ... | 0 | ADL⟨2⟩→/SDL⟨2⟩ |
QPW 
(E_3) Scan⟨3⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 1 | 0 | 0 | ... | 0 | 0 | 0 | ... | 0 | ADL⟨3⟩→/SDL⟨3⟩ |
Fail 
⋮
(E_7) Scan⟨7⟩
| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 1 | 0 | 0 | ... | 1 | 0 | 0 | ... | 1 | ADL⟨7⟩→/SDL⟨7⟩ |

(G) TRANSMIT INVERTED DATA OF BDL TO SDL

| IO | 0 | 1 | 2 | 3 | ... | 7 | 0 | 1 | ... | 7 | |
|---|---|---|---|---|---|---|---|---|---|---|---|
| i | 0 | 1 | 2 | 3 | ... | 7 | 8 | 9 | ... | N-1 | |
| ADLi | 0 | 0 | 1 | 1 | ... | 0 | 1 | 1 | ... | 0 | |
| BDLi | 0 | 0 | 0 | 1 | ... | 0 | 0 | 1 | ... | 0 | |
| SDLi | 1 | 1 | 1 | 0 | ... | 1 | 1 | 0 | ... | 1 | BDL→/SDL |

APPLY VQPW TO BL("QPW"), AND APPLY VQPW

SEMICONDUCTOR MEMORY DEVICE IN WHICH BIT LINE PRE-CHARGING, WHICH IS BASED ON RESULT OF VERIFY OPERATION, IS INITIATED PRIOR TO COMPLETION OF THE VERIFY OPERATION

CROSS-REFERENCE TO RELATED APPLICATION

This application is based upon and claims the benefit of priority from Japanese Patent Application No. 2016-174636, filed Sep. 7, 2016, the entire contents of which are incorporated herein by reference.

FIELD

Embodiments described herein relate generally to a semiconductor memory device.

BACKGROUND

NAND-type flash memories are known as semiconductor memory devices.

DESCRIPTION OF THE DRAWINGS

FIG. 8 is a diagram illustrating an example of data stored in latch circuits of the semiconductor memory device according to the first embodiment during the write operation.

FIG. 9 is a diagram illustrating an example of data stored in latch circuits of the semiconductor memory device according to the first embodiment during a scanning operation.

FIG. 14 is a diagram illustrating an example of data stored in latch circuits of the semiconductor memory device according to the second embodiment during the write operation.

FIG. 15 is a diagram illustrating an example of data stored in latch circuits of the semiconductor memory device according to the second embodiment during a scanning operation.

FIG. 22 is a diagram illustrating an example of data stored in latch circuits of the semiconductor memory device according to the fourth embodiment during the write operation.

FIG. 23 is a diagram illustrating an example of data stored in latch circuits of the semiconductor memory device according to the fourth embodiment during a scanning operation.

DETAILED DESCRIPTION

Figure 1:
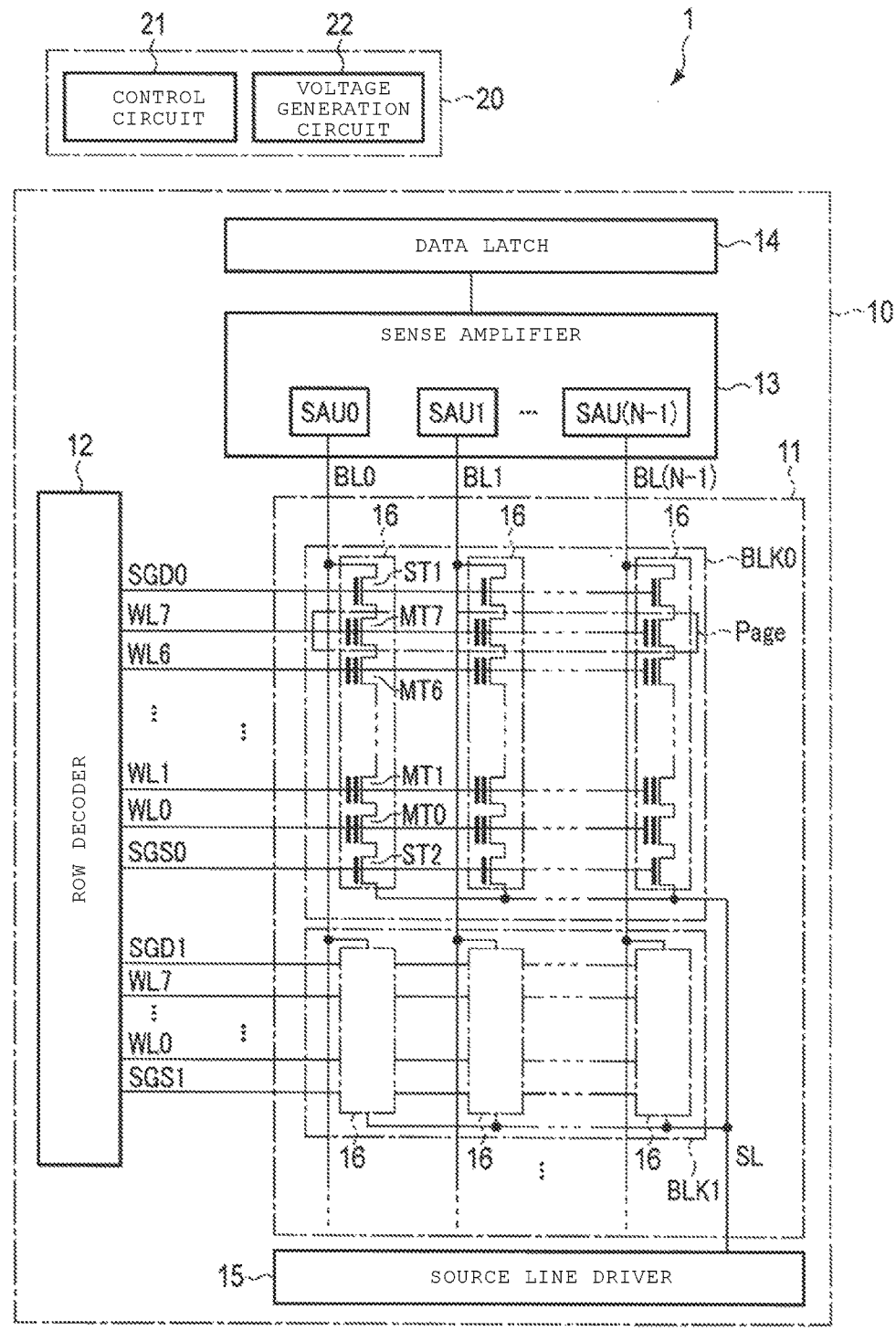
FIG. 1 is a block diagram of a semiconductor memory device according to a first embodiment.

Embodiments provide a semiconductor memory device capable of improving processing capability.

In general, according to one embodiment, a semiconductor memory device includes a memory cell, a bit line electrically connected to the memory cell, a sense amplifier electrically connected to the bit line and including a first latch circuit, and a controller configured to execute a write operation on the memory cell. The write operation includes a first program operation followed by a verify operation that includes a step of updating data of the first latch and a second program operation that includes a step of pre-charging the bit line, wherein the step of pre-charging the bit line is initiated prior to the data of the first latch is updated.

Hereinafter, embodiments will be described with reference to the accompanying drawings. In the description, common portions are denoted by common reference numerals and signs throughout the drawings.

1. First Embodiment

A nonvolatile semiconductor memory device according to a first embodiment will be described. In the following, a planar NAND-type flash memory in which memory cell transistors are two-dimensionally arranged on a semiconductor substrate will be described as an example of the semiconductor memory device.

1.1 With Regard to Configuration

1.1.1 With Regard to Overall Configuration of Semiconductor Memory Device

First, the overall configuration of a semiconductor memory device will be described with reference to FIG. 1. As illustrated in the drawing, a NAND-type flash memory 1 generally includes a core unit 10 and a peripheral circuit 20.

The core unit 10 includes a memory cell array 11, a row decoder 12, a sense amplifier 13, a data latch 14, and a source line driver 15.

The memory cell array 11 includes a plurality of blocks BLK (BLK0, BLK1, . . . ) which are a set of a plurality of nonvolatile memory cell transistors. For example, pieces of data in the same block BLK are collectively erased.

Each of the blocks BLK includes a plurality of NAND strings 16, and each of the NAND strings 16 includes a plurality of memory cell transistors MT which are connected to each other in series. The memory cell transistors MT are two-dimensionally arranged on a semiconductor substrate. Meanwhile, the number of NAND strings 16 included in one block BLK is not limited to any particular number.

Each of the NAND strings 16 includes, for example, eight memory cell transistors MT (MT0 to MT7) and select transistors ST1 and ST2. The memory cell transistor MT includes a stacked gate including a control gate and a charge storage layer, and stores data in a nonvolatile manner. Meanwhile, the memory cell transistor MT may be a MONOS type in which an insulating film is used for the charge storage layer, or may be an FG type in which a conductive film is used for the charge storage layer. Further, the number of memory cell transistors MT is not limited to eight. The number of memory cell transistors may be 16, 32, 64, 128, or the like, and it is not limited to these numbers.

In this embodiment, the memory cell transistor MT can store data of 1 bit, that is, either data of "1" or data of "0". In addition, in this embodiment, a state where no charge or barely any charge is injected into the charge storage layer is defined as a state where the memory cell transistor MT stores data of "1". On the other hand, a state where charge is injected into the charge storage layer is defined as a state where the memory cell transistor MT stores data of "0". Accordingly, a threshold voltage of a memory cell transistor MT storing data of "1" is lower than a threshold voltage of a memory cell transistor MT storing data of "0". Meanwhile, a relationship between each piece of data and a threshold value level is not limited to the above-description, and can be appropriately changed. Further, a memory cell transistor MT may store data of 2 bits or more.

The memory cell transistors MT0 to MT15 within one NAND string 16 have current paths that are connected to each other in series. A drain of the memory cell transistor MT15 on one end side of the series connection is connected to the source of the select transistor ST1, and the source of the memory cell transistor MT0 on the other end side is connected to the drain of the select transistor ST2.

Gates of select transistors ST1 within the same block BLK are connected to the same selected gate line SGD in common. In the example in FIG. 1, gates of select transistors ST1 in the block BLK0 are connected to a selected gate line SGD in common, and gates of select transistors ST1 (not illustrated in the drawing) in the block BLK1 are connected to a selected gate line SGD1 in common. Similarly, gates of select transistors ST2 within the same block BLK are connected to the same selected gate line SGS in common.

In addition, control gates of memory cell transistors MT0 to MT15 in the same block BLK are respectively connected to different word lines WL0 to WL15 in common.

In addition, drains of select transistors ST1 of NAND strings 16 in the same row, among NAND strings 16 which are arranged in a matrix layout within the memory cell array 11, are respectively connected to different bit lines BL (BL0 to BL (N−1), (N−1) is a natural number of 1 or greater), and drains of select transistors ST1 of NAND strings 16 in the same column are connected to one of bit lines BL0 to BL(N−1) in common. That is, the bit lines BL are each connected to one NAND string 16 in each of the blocks BLK. In addition, sources of select transistors ST2 included in each of the blocks BLK are connected to a source line SL in common. That is, the source line SL is connected to NAND strings 16 within the memory cell array 11 in common.

Writing and read-out of data are collectively performed on memory cell transistors MT connected to any word line WL in any block BLK. This unit will be referred to as a "page".

The row decoder 12 decodes a block address or a page address, for example, during the writing and read-out of data to select a word line WL corresponding to a target page. The row decoder 12 adds an appropriate voltage to a selected word line WL, a non-selected word line WL, and selected gate lines SGD and SGS.

The sense amplifier 13 includes, for example, sense amplifier units SAUi (i=0 to (N−1)) corresponding respectively to bit lines BLi (i=0 to (N−1), N−1 is an integer of 1 or greater). The sense amplifier unit SAUi senses data which is read out to the bit line BLi from a memory cell transistor MT during the read-out of data, and transmits write data to the memory cell transistor MT through the bit line BLi during the writing of data. Hereinafter, the bit line BLi and the sense amplifier unit SAUi will be referred to as a bit line BL and a sense amplifier unit SAU, respectively, in a case where they do not need to be distinguished from other bit lines and other sense amplifiers. In addition, the sense amplifier unit SAU includes a latch circuit for storing data. Details of the sense amplifier unit SAU will be described later.

The data latch 14 temporarily stores data which is sensed by the sense amplifier 13 during the read-out of data, and transmits the stored data to an external controller or a host device through an input and output circuit (not illustrated in the drawing). In addition, the data latch temporarily stores write data which is input from the external controller or the host device through the input and output circuit during the writing of data, and transmits the stored write data to the sense amplifier 13.

The source line driver 15 applies a necessary voltage to a source line SL during the writing, read-out, and erasing.

The peripheral circuit 20 includes a control circuit 21 and a voltage generation circuit 22.

The control circuit 21 controls the overall operation of the NAND-type flash memory 1.

The voltage generation circuit 22 generates voltages necessary for the writing, read-out, and erasing of data, and applies the generated voltages to the row decoder 12, the sense amplifier 13, and the source line driver 15. The row decoder 12, the sense amplifier 13, and the source line driver 15 apply voltages, supplied from the voltage generation circuit 22, to memory cell transistors MT.

Meanwhile, in this example, a description is given where memory cell transistors MT are two-dimensionally arranged on a semiconductor substrate, but the memory cell transistors may be three-dimensionally arranged on the semiconductor substrate, for example, as disclosed in U.S. patent application Ser. No. 12/407,403, filed on Mar. 19, 2009, which is entitled "THREE DIMENSIONAL STACKED NONVOLATILE SEMICONDUCTOR MEMORY," U.S. patent application Ser. No. 12/406,524, filed on Mar. 18, 2009, which is entitled "THREE DIMENSIONAL STACKED NONVOLATILE SEMICONDUCTOR MEMORY," U.S. patent application Ser. No. 12/679,991, filed on Mar. 25, 2010, which is entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, which is entitled "SEMICONDUCTOR MEMORY AND METHOD FOR MANUFACTURING SAME." These patent applications are incorporated by reference herein in their entireties.

Further, the erasing range of data is not limited to one block BLK. Pieces of data in a plurality of blocks BLK may be collectively erased, and pieces of data in regions within one block BLK may be collectively erased separately.

Such alternative methods of erasing data are disclosed in U.S. patent application Ser. No. 12/694,690, filed on Jan. 27, 2010, which is entitled "NON-VOLATILE SEMICONDUCTOR STORAGE DEVICE," and U.S. patent application Ser. No. 13/235,389, filed on Sep. 18, 2011, which is entitled "NONVOLATILE SEMICONDUCTOR MEMORY DEVICE." These patent applications are incorporated by reference herein in their entireties.

1.1.2 With Regard to Configurations of Sense Amplifier and Data Latch

Figure 2:
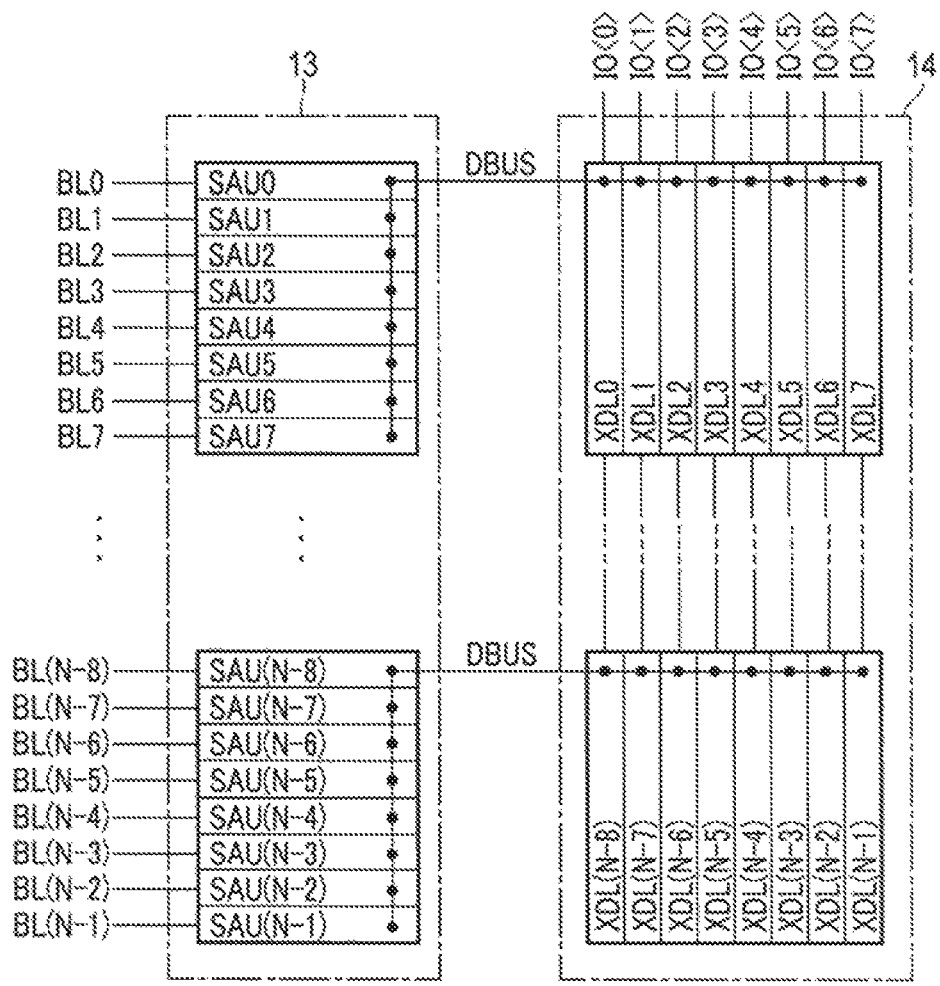
FIG. 2 is a block diagram illustrating a sense amplifier and a data latch which are included in the semiconductor memory device according to the first embodiment.

Next, configurations of the sense amplifier 13 and the data latch 14 will be described with reference to FIG. 2.

As illustrated in the drawing, the sense amplifier 13 includes sense amplifier units SAU (SAU0 to SAU(N−1)). In addition, the data latch 14 includes latch circuits XDL (XDL0 to XDL(N−1)).

The sense amplifier unit SAU is provided, for example, for each bit line BL. For example, eight sense amplifier units SAU are connected to one bus DBUS in common. Meanwhile, the number of sense amplifier units SAU connected to one bus DBUS is not limited to any particular number.

The latch circuit XDL is provided for each sense amplifier unit SAU, and temporarily stores data related to the corresponding bit line BL. More specifically, data which is received from an external controller or a host device is stored in the latch circuit XDL through a data line IO, and is then transmitted to the corresponding sense amplifier unit SAU through a bus DBUS, and vice versa.

Eight sense amplifier units SAU and the corresponding eight latch circuits XDL are connected to one bus DBUS in common, and eight latch circuits XDL are each connected to one of eight data lines IO<x> (x is any of integers of 0 to 7. IO<0> to IO<7>). More specifically, eight sense amplifier units SAU0 to SAU7 and the corresponding eight latch circuits XDL0 to XDL7 are connected to one bus DBUS in common. The latch circuits XDL0 to XDL7 are connected to the data lines IO<0> to IO<7>, respectively. Meanwhile, the number of data lines IO is not limited to any particular number.

In the following, a group of the plurality of latch circuits XDL (XDL0, XDL8, . . . , (N−8)) connected to the data line IO<0> in common is denoted by XDL<0>, and a group of the plurality of sense amplifier units SAU (SAU0, SAU8, . . . SAU(N−8) corresponding to the latch circuit XDL<0> is denoted by SAU<0>. Similarly, groups of the latch circuits XDL connected to the data lines IO<1> to IO<7> in common are denoted by XDL<1> to XDL<7>, and groups of the corresponding sense amplifier units SAU are denoted by SAU<1> to SAU<7>.

1.1.3 With Regard to Configuration of Sense Amplifier Unit

Next, a configuration of a sense amplifier unit SAU will be described with reference to FIG. 3. Meanwhile, in this embodiment, a current sensing type sense amplifier unit SAU that senses a current flowing through a bit line BL is described as an example, but a voltage sensing type sense amplifier unit SAU may be used.

Figure 3:
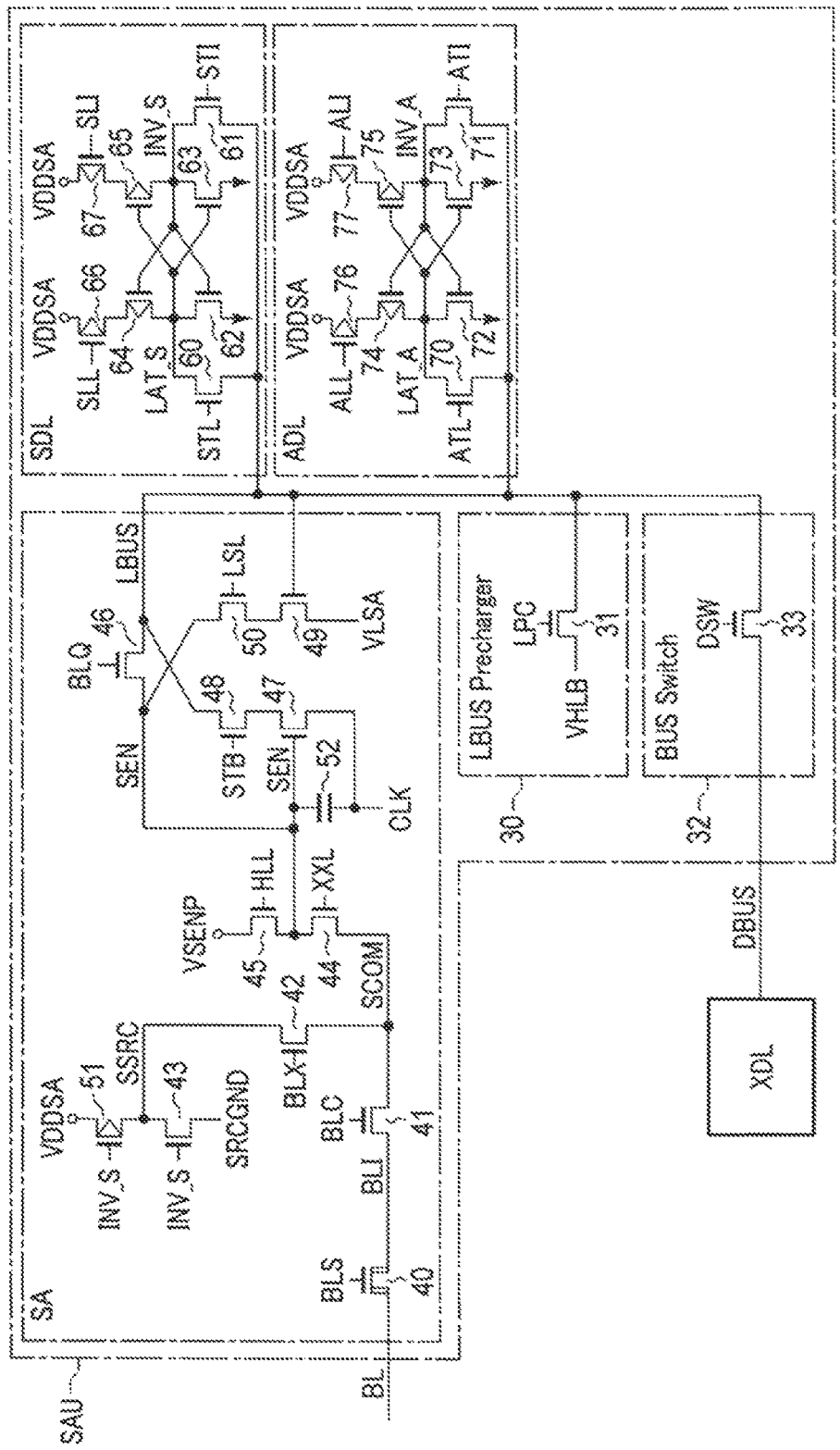
FIG. 3 is a circuit diagram of a sense amplifier unit included in the semiconductor memory device according to the first embodiment.

As illustrated in FIG. 3, the sense amplifier unit SAU includes a sense amplifier section SA, latch circuits SDL and ADL, an LBUS precharge circuit 30, and a BUS switch circuit 32.

The sense amplifier section SA senses data which is read out to the bit line BL, and applies a voltage to the bit line BL in accordance with programming data. The sense amplifier section SA includes a high breakdown voltage n-channel MOS transistor 40, low breakdown voltage n-channel MOS transistors 41 to 50, a low breakdown voltage p-channel MOS transistor 51, and a capacitor element 52.

The bit line BL is connected to a node SCOM through the transistor 40 including a gate to which a signal BLS is input, a node BLI, and the transistor 41 including a gate to which a signal BLC is input.

The node SCOM is connected to a node SSRC through the transistor 42 including a gate to which a signal BLX is input, and is connected to a node SEN through the transistor 44 including a gate to which a signal XXL is input.

The node SSRC is connected to, for example, a node SRCGND having a ground voltage VSS applied thereto through the transistor 43, and receives a power supply voltage VDDSA applied through the transistor 51. Gates of the transistors 43 and 51 are connected to nodes INV_S, respectively.

The node SEN is connected to a voltage VSENP through the transistor 45 including a gate to which a signal HLL is input. The node SEN is connected to a node to which a clock CLK is input through the capacitor element 52. The node SEN is connected to a voltage VLSA through the transistor 50 including a gate to which a signal LSL is input and the transistor 49 of which the gate is connected to a bus LBUS. For example, the voltage VLSA may be a ground voltage VSS. The node SEN is connected to the bus LBUS through the transistor 46 including a gate to which a signal BLQ is input. Further, the node SEN is connected to the gate of the transistor 47.

The bus LBUS is connected to a node to which a clock CLK is input, through the transistor 48 including a gate to which a signal STB is input and the transistor 47.

Next, the latch circuits SDL and ADL will be described. The latch circuits SDL and ADL temporarily store data. The sense amplifier section SA controls the bit line BL in accordance with data stored in the latch circuit SDL. Meanwhile, the number of latch circuits is not limited to any particular number.

The latch circuit SDL includes low breakdown voltage n-channel MOS transistors 60 to 63 and low breakdown voltage p-channel MOS transistors 64 to 67.

The bus LBUS is connected to a node LAT_S through the transistor 60 including a gate to which a signal STL is input, and is connected to a node INV_S through the transistor 61 including a gate to which a signal STI is input.

The node LAT_S is grounded through the transistor 62, and is connected to a power supply voltage VDDSA through the transistor 64 and the transistor 66 including a gate to which a signal SLL is input. In addition, the node LAT_S is connected to gates of the transistors 63 and 65.

The node INV_S is grounded through the transistor 63, and is connected to a power supply voltage VDDSA through the transistor 65 and the transistor 67 including a gate to which a signal SLI is input. In addition, the node INV_S is connected to gates of the transistors 62 and 64.

In the latch circuit SDL, a first inverter includes the transistors 62 and 64, and a second inverter includes the transistors 63 and 65. The latch circuit SDL stores data in the node LAT_S, and stores inverted data thereof in the node INV_S.

The latch circuit ADL has the same configuration as that of the latch circuit SDL. Although its description is omitted, the transistors and names of signals thereof will be distinguished from those of the latch circuit SDL as in FIG. 3. Transistors 70 to 77 of a latch circuit ADL and signals ATL, ATI, ALL, and ALI are equivalent to the transistors 60 to 67 of the latch circuit SDL and the signals STL, STI, SLL, and SLI, respectively.

The LBUS precharge circuit 30 precharges the bus LBUS. The LBUS precharge circuit 30 includes, for example, a low breakdown voltage n-channel MOS transistor 31. The transistor 31 is configured such that a signal LPC is input to a gate thereof, and transmits a voltage VHLB to the bus LBUS.

The BUS switch circuit 32 connects the bus LBUS and the bus DBUS to each other. The BUS switch circuit 32 includes, for example, a low breakdown voltage n-channel MOS transistor 33. The transistor 33 is configured such that a signal DSW is input to a gate thereof, and connects the bus LBUS and the bus DBUS to each other.

Meanwhile, various signals in the sense amplifier unit SAU having the above-described configuration are supplied by, for example, the control circuit 21.

1.2 With Regard to Write Operation

Next, a write operation of data will be simply described. The write operation generally includes programming and verification.

Programming refers to an operation of injecting electrons into a charge storage layer to increase a threshold voltage of a memory cell transistor MT (or inhibiting injection to prevent an increase a threshold voltage). In the following, an operation of increasing a threshold voltage is referred to as programming of "0" or writing of "0". Data of "0" is given to a target memory cell transistor MT by programming of "0". In addition, a bit line BL which is a target for programming of "0" is referred to as a bit line BL("0"). On the other hand, an operation of not increasing a threshold voltage is referred to as programming of "1", writing of "1", or writing inhibition. Data of "1" is given to a target memory cell transistor MT by programming of "1". A bit line BL which is a target for programming of "1" is referred to as a bit line BL("1").

Verification is an operation of reading out data (hereinafter, also referred to as "strobing") after programming and determining whether a threshold voltage of a memory cell transistor MT reaches a target level (verification level). A case where the threshold voltage of the memory cell transistor MT reaches the target level (verification level) is referred to as "passing of verification", and a case where the threshold voltage of the memory cell transistor MT does not reach the target level is referred to as "failure in verification". The memory cell transistor MT having a threshold voltage reaching the target level (passing the verification) is inhibited from writing thereafter.

Hereinafter, an operation of updating data of the latch circuit SDL for the next programming based on read-out data in verification, that is, an operation of storing programming data in the latch circuit SDL is referred to as scanning. When verification is failed, data of "0" is stored in the latch circuit SDL by scanning, and programming of "0" is subsequently performed in programming. In addition, when verification is passed, data of "1" is stored in the latch circuit SDL by scanning to inhibit writing in subsequent programming. Meanwhile, the scanning is not limited to an operation of updating the latch circuit SDL based on results of the verification result. The scanning includes various computational processes performed by the sense amplifier unit SAU when the sense amplifier unit SAU charges the bit line BL with a voltage.

Hereinafter, in this embodiment, a description will be given of a case where the updating of data of a latch circuit SDL by scanning, that is, the storage of the next programming data in the latch circuit SDL is performed for each sense amplifier unit SAU<x> corresponding to a data line IO<x>. More specifically, the updating of data of the corresponding latch circuit SDL is performed in order of SAU<0>, SAU<1>, . . . , SAU<7>. Meanwhile, the order of updating of data of a latch circuit SDL by scanning can be set to be a different order. In addition, data of a latch circuit SDL may be updated in order of the sense amplifier units SAU0, SAU1, . . . , SAU(N−1), that is, for each sense amplifier unit SAU, or pieces of data of latch circuits SDL of all of the sense amplifier units SAU may be collectively updated.

Hereinafter, a combination of programming and verification will be referred to as a programming loop. A threshold voltage of a memory cell transistor MT rises to a target level by repeating the programming loop.

1.2.1 With Regard to Overall Flow of Write Operation

Figure 4:
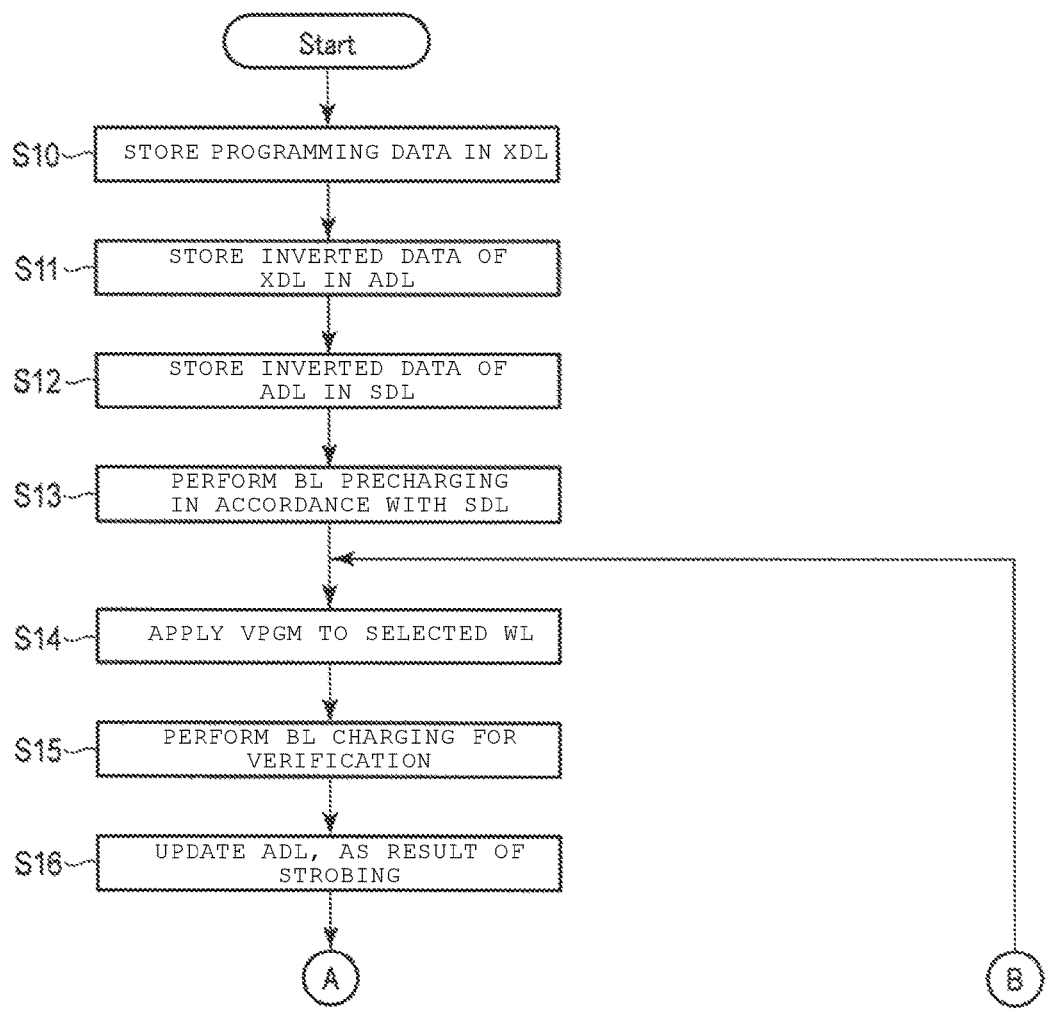
FIGS. 4-5 are flow charts illustrating a write operation of the semiconductor memory device according to the first embodiment.
Figure 5:
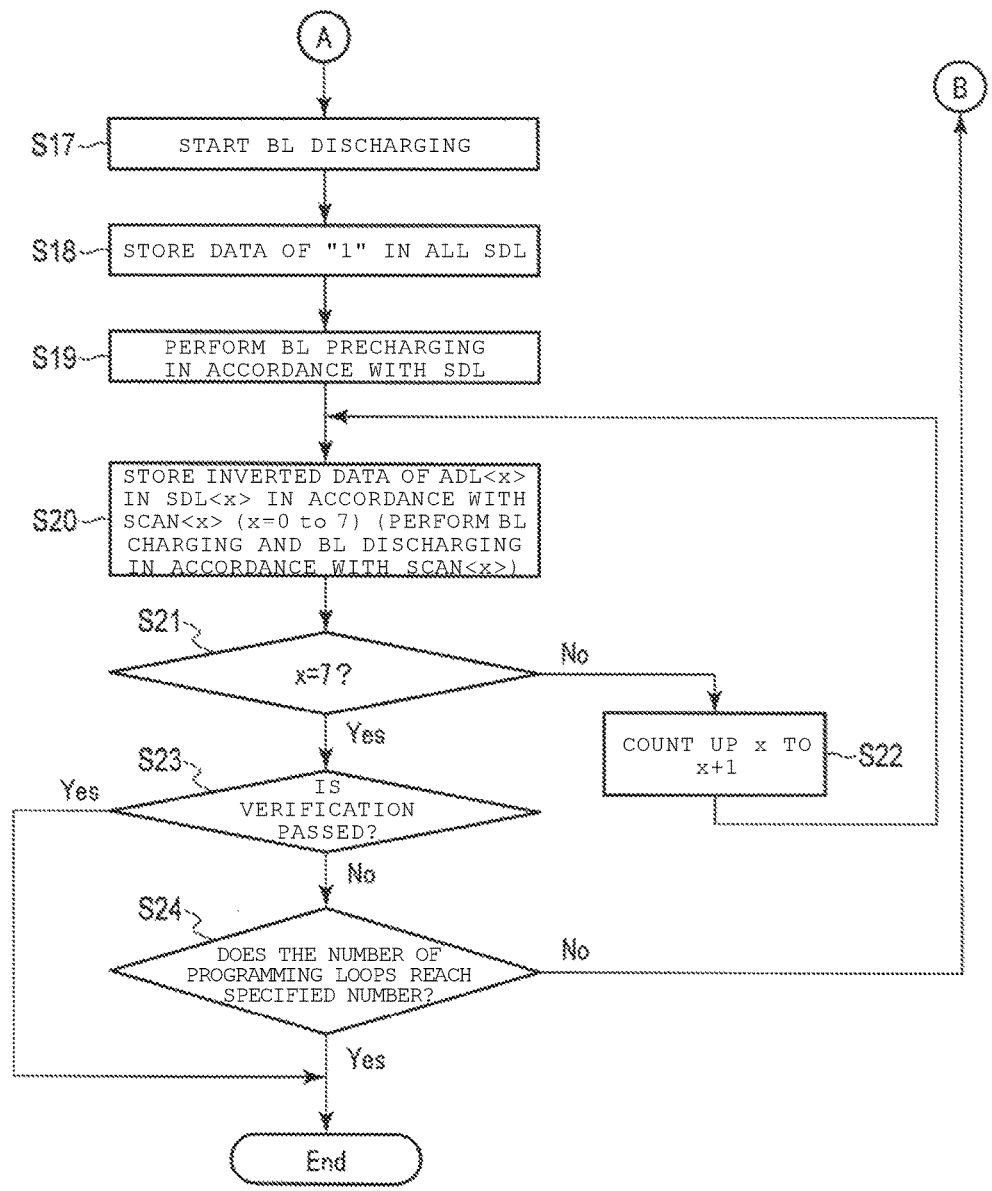

First, the overall flow of a write operation will be described with reference to FIGS. 4 and 5. FIGS. 4 and 5 are flow charts illustrating a flow of a write operation.

As illustrated in the drawing, first, the control circuit 21 stores programming data received from, for example, an external controller in a latch circuit XDL (step S10).

Next, the control circuit 21 stores inverted data of the programming data, which is stored in the latch circuit XDL, in a latch circuit ADL (step S11). Further, the control circuit 21 stores inverted data of the data stored in the latch circuit ADL, that is, programming data in a latch circuit SDL (step S12).

Next, the sense amplifier 13 starts charging of each bit line BL (hereinafter, referred to as "BL precharging") in accordance with data of the latch circuit SDL for programming (step S13). More specifically, when the latch circuit SDL stores data of "1", a node INV_S is set to be at "L" level. Accordingly, a transistor 51 of the corresponding sense amplifier unit SAU is set to be in an on state. Therefore, a voltage VBL1 obtained by clamping a voltage VDDSA by a transistor 41 is applied to a bit line BL("1"). A voltage VBL1 is a BL precharge voltage for programming of "1". In addition, when the latch circuit SDL stores data of "0", the node INV_S is set to be at "H" level, and a transistor 43 of the corresponding sense amplifier unit SAU is set to be in an on state. Therefore, a bit line BL("0") is grounded, and a ground voltage VSS is applied. That is, the bit line BL is charged and discharged in accordance with data of the latch circuit SDL.

Next, the row decoder 12 applies a voltage VPGM to a selected word line WL, and writes data in a target memory cell transistor MT (step S14). More specifically, the row decoder 12 selects any word line WL in a selected block BLK, applies the voltage VPGM to the selected word line WL, and applies a voltage VPASS to the other non-selected word lines WL. The voltage VPGM is a high voltage for injecting electrons into a charge storage layer. The voltage VPASS sets the memory cell transistor MT to be in an on state, regardless of the threshold voltage of the memory cell transistor MT. Between the voltage VPGM and the voltage VPASS, a relationship of VPGM>VPASS is established. Thereby, data of "1" or data of "0" is programmed in the target memory cell transistor MT.

Next, the control circuit 21 starts verification and charges the bit line BL (step S15). More specifically, for example, data of "1" is stored in a latch circuit SDL of each sense amplifier unit SAU. That is, the node INV_S is set to beat "L" level. Therefore, a voltage VBL2 obtained by clamping the voltage VDDSA by the transistor 41 is applied to a bit line BL. The voltage VBL2 is a BL precharge voltage for verification.

In the following description, a description will be given of a case where a voltage VBL2 is applied to all of the bit lines BL in verification, but the voltage VBL2 may be applied to some of the bit lines BL. For example, the voltage VBL2 may be applied to the bit lines BL by storing data of "1" in a latch circuit SDL which is a target for verification, and a voltage VSS may be applied to the bit lines BL by storing data of "0" in a latch circuit SDL which is not a target for verification. For example, when a memory cell transistor can store data of four values (2 bits), the voltage VBL2 may be applied to bit lines BL corresponding to a target write level, and the voltage VSS may be applied to bit lines BL corresponding to other write levels.

Next, the control circuit 21 performs strobing of data in each sense amplifier unit SAU, and updates a latch circuit ADL (step S16). More specifically, data of "0" is maintained in a latch circuit ADL corresponding to programming of "1". In programming of "0", data of "1" is updated to data of "0" in a latch circuit ADL corresponding to a memory cell transistor MT that passes verification. In programming of "0", data of "1" is maintained in a latch circuit ADL corresponding to a memory cell transistor MT that fails in verification. At this time, inverted data of data stored in the latch circuit ADL serves as programming data for the next time.

Next, the control circuit 21 starts a bit line BL discharging (step S17). More specifically, the control circuit 21 discharges the voltage VBL2 that has been charged in the bit line BL during verification. For example, the control circuit 21 sets a signal BLS to be at "L" level to set the transistor 40 to be in an off state. Thereby, the sense amplifier units SAU and the bit lines BL are electrically cut off, and the voltage VBL2 of the bit line BL is discharged to a source line SL side.

Next, the control circuit 21 stores data of "1" in all of the latch circuits SDL in order to charge all of the bit lines BL one time (step S18). More specifically, the control circuit 21 stores data of "1" in all of the latch circuits SDL before BL precharging has started after the discharging of the bit lines BL has started, that is, after the sense amplifier units SAU and the bit lines BL are electrically cut off. Meanwhile, in this embodiment, data of "1" is stored in all of the latch circuits SDL when verification is started, and thus this step may be omitted.

Next, the sense amplifier 13 starts BL precharging in accordance with data of the latch circuit SDL for programming (step S19). More specifically, the sense amplifier 13 starts charging the bit line BL with a voltage VBL1 in accordance with data of "1" of the latch circuit SDL.

Next, the control circuit 21 starts scanning. In a scanning operation, the control circuit 21 transmits inverted data (programming data for the next time) of a latch circuit ADL of the corresponding sense amplifier unit SAU<x> in each of cases of x=0 to 7, to a latch circuit SDL (step S20). In the following, latch circuits SDL and ADL of the sense amplifier unit SAU<x> are denoted by SDL<x> and ADL<x>, respectively. In addition, scanning corresponding to the sense amplifier unit SAU<x> is denoted by Scan<x>. That is, the latch circuit SDL<x> is updated in accordance with the Scan<x>.

Meanwhile, scanning is performed during the charging and discharging of a bit line BL. For example, scanning may be performed during the discharging of a bit line BL when verification is terminated, or may be started after BL precharging is started for the next programming. In the following, a description will be given of a case where scanning is performed after BL precharging is started for convenience of description.

When Scan<x> is performed during BL precharging, BL precharging is performed based on updated data of the latch circuit SDL<x>, that is, programming data for the next time in the sense amplifier unit SAU<x>. For example, when the latch circuit SDL<x> stores data of "1" even after scanning, a voltage VBL1 is subsequently applied to the corresponding bit line BL. On the other hand, when data of the latch circuit SDL<x> is updated to data of "0", a voltage VSS is applied to the corresponding bit line BL.

In a case of x not being equal to 7, that is, in a case of not reaching Scan<7> (step S21_No), the control circuit 21 counts up x to x+1 (step S22), and repeats the operations of steps S20 to S21. That is, Scan<0> to Scan<7> are sequentially performed. The control circuit 21 terminates the scanning when x reaches 7 (step S20_Yes).

Next, the control circuit 21 determines verification (step S23). More specifically, when the number of bits failing in verification is less than a specified number which is set in advance, the control circuit determines that the verification has passed (step S23_Yes), and completes the write operation.

On the other hand, when the number of bits failing in verification is equal to or greater than the specified number, the control circuit determines that the verification has failed (step S23_No). When the number of programming loops reaches a specified number which is set in advance (step S24_Yes), the control circuit 21 terminates the write operation and notifies, for example, an external controller that the write operation has not normally terminated. In addition, when the number of programming loops does not reach the specified number (step S24_No), the control circuit 21 returns to step S14 to perform programming again.

1.2.2 With Regard to Voltages of Wirings in Write Operation

Figure 6:
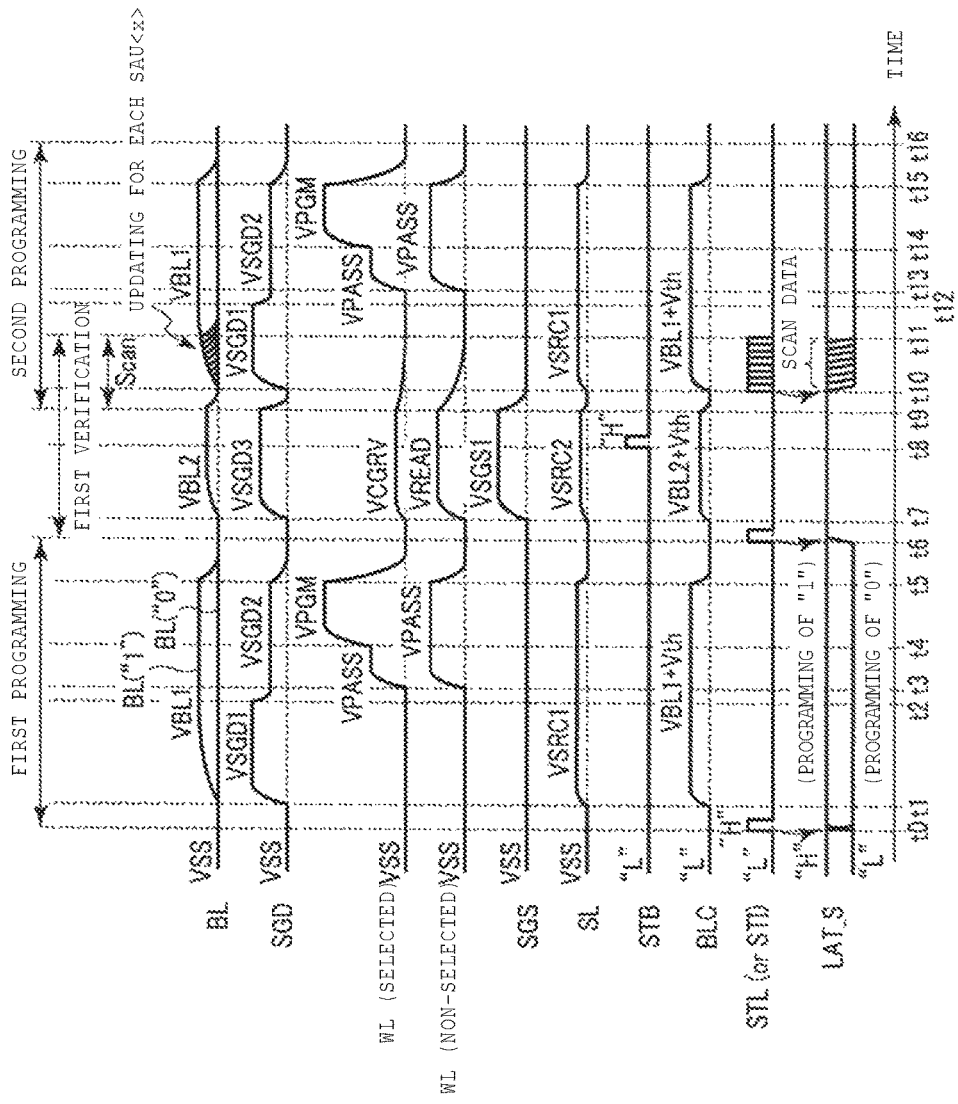
FIG. 6 is a timing chart illustrating potentials of wirings of the semiconductor memory device according to the first embodiment during a write operation.
Figure 7:
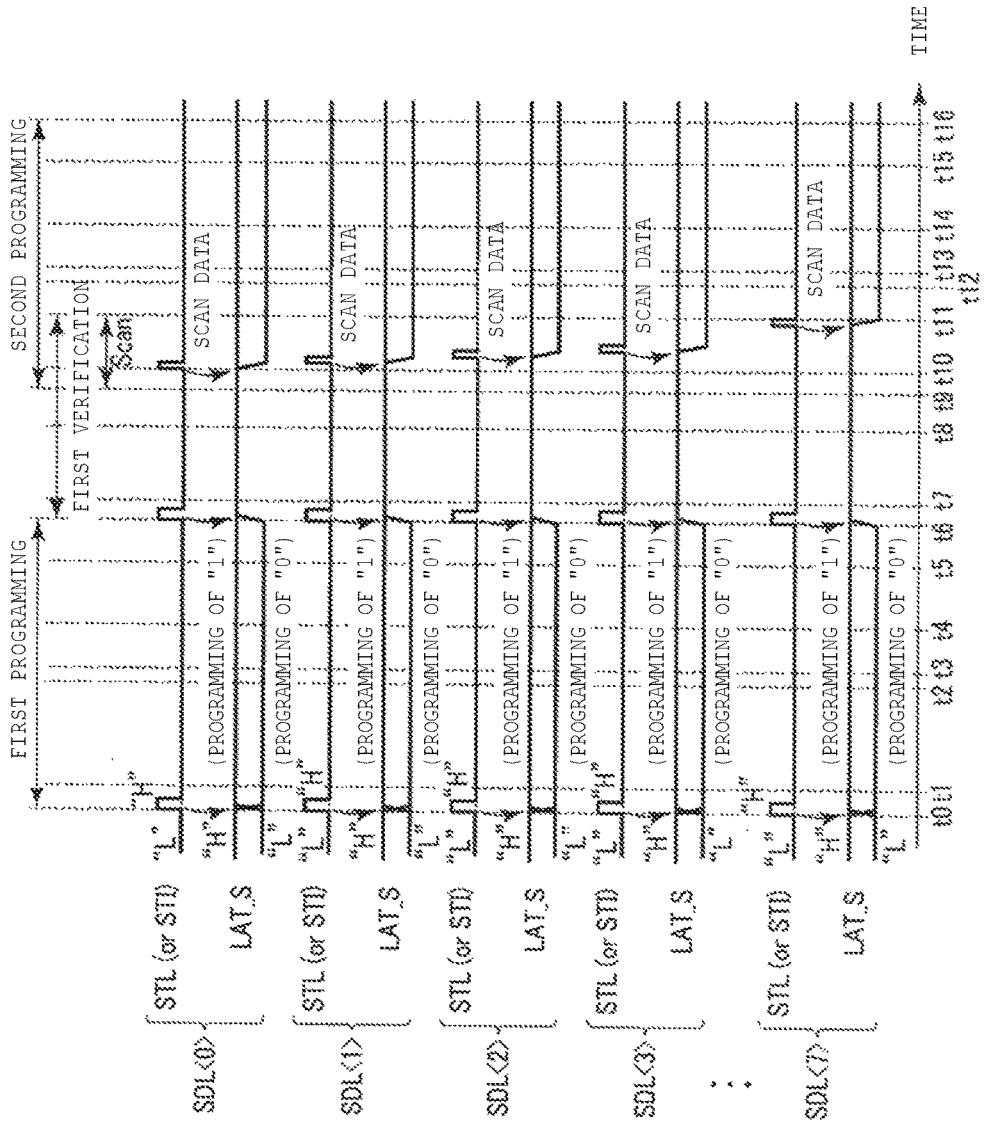
FIG. 7 is a diagram illustrating potentials of a signal and a node for each latch circuit during the write operation.

Next, voltages of wirings in programming will be described with reference to FIGS. 6 and 7. FIG. 6 illustrates changes in voltages of wirings in first programming, first verification, and second programming. FIG. 7 illustrates voltages of the signal STL and the node LAT_S in FIG. 6 for each latch circuit SDL<x>. FIGS. 6 and 7 illustrate examples of a case where scanning of first verification is started after BL precharging of second programming is started.

As illustrated in the drawing, the first programming is performed between times t0 to t6, the first verification is performed between times t6 to t11, and the second programming is performed between times t9 to t16. In addition, scanning of the first verification is performed between the times t9 to t11.

First, the first programming will be described. At the time t0, the control circuit 21 sets, for example, the signal STL of the latch circuit SDL to be at "H" level for a preset period of time to set the transistor 60 to be in an on state, and stores inverted data (first programming data) of the latch circuit ADL in the latch circuit SDL. More specifically, the control circuit 21 sets the signal ATI of the latch circuit ADL to be at "H" level to set the transistor 71 to be in an on state, and transmits inverted data of the latch circuit ADL to a bus LBUS. Next, the control circuit 21 sets the signal SLL of the latch circuit SDL to be at "H" level to set the transistor 66 to be in an off state, and then sets the signal STL to be at "H" level to take data of the bus LBUS in the latch circuit SDL. Meanwhile, the control circuit 21 may set the signal ATL of the latch circuit ADL to be at "H" level to transmit data of the latch circuit ADL to the bus LBUS, and then may set the signal SLI and the signal STI of the latch circuit SDL to be at "H" level to take inverted data of the bus LBUS.

In the latch circuit SDL in which data of "1" is stored, the node LAT_S is set to be at "H" level, and the node INV_S is set to be at "L" level. Accordingly, the transistor 51 of the sense amplifier unit SAU is set to be in an on state, and the voltage VDDSA is applied to the node SSRC of the sense amplifier unit SAU. On the other hand, in the latch circuit SDL in which data of "0" is stored, the node LAT_S is set to be at "L" level, and the node INV_S is set to be at "H" level. Accordingly, the transistor 43 of the sense amplifier unit SAU is set to be in an off state, and the voltage VSS is applied to the node SSRC.

At the time t1, the control circuit 21 sets the signal BLC to be at "H" level by applying a voltage "VBL1+Vt41" (Vt41; a threshold voltage of a transistor 41) to the gate of the transistor 41. Between the voltage VBL1 and the voltage VDDSA, a relationship of VDDSA>VBL1 is established. In addition, the control circuit 21 sets the signal BLS and the signal BLX (not illustrated in the drawing) to be at "H" level to set the transistor 40 and the transistor 42 to be in an on state. As a result, the sense amplifier 13 applies the voltage VBL1 clamped by the transistor 41 to the bit line BL("1"), and applies a voltage VSS to the bit line BL("0"). That is, BL precharging is performed.

The source line driver 15 applies a voltage VSRC1 (>VSS) to the source line SL under the control of the control circuit 21. The row decoder 12 applies the voltage VSGD1 to the selected gate line SGD of the selected block BLK under the control of the control circuit 21, and applies the voltage VSS to the selected gate line SGS. A voltage VSGD1 sets the select transistors ST1 corresponding to the bit lines BL("1") and BL("0") to be in an on state. When threshold voltages of the select transistors ST1 and ST2 are set as Vthsg, between the voltage VSGD1 and the voltage VBL1, a relationship of "VSGD1−Vthsg"≥VBL1 is established. In addition, the select transistor ST2 is set to be in a cut-off state due to the voltage VSRC1 being applied to the source line SL and VSS being applied to the gate. As a result, in the selected block BLK, the channel potential of the NAND string 16 connected to the bit line BL("1") rises to VBL1, and the channel potential of the NAND string 16 connected to the bit line ("0") is set as VSS.

At the time t2, the row decoder 12 applies a voltage VSGD2 to the selected gate line SGD. The voltage VSGD2 sets the select transistor ST1 corresponding to the bit line BL("1") to be in a cut-off state. Between the voltage VSGD2 and the voltage VBL1, a relationship of "VSGD2−Vthsg"<VBL1 is established. Thereby, the channel of the NAND string 16 corresponding to the bit line BL("1") is set to be in a floating state, and the channel potential of the NAND string 16 connected to the bit line ("0") subsequently maintains VSS.

At the time t3, the row decoder 12 applies the voltage VPASS to the word line WL of the selected block BLK.

At the time t4, the row decoder 12 applies the voltage VPGM to the selected word line WL. Thereby, data is written in a target memory cell transistor MT.

More specifically, in the NAND string 16 corresponding to the bit line BL("0"), the select transistor ST1 is set to be in an on state. For this reason, the channel potential of the memory cell transistor MT connected to the selected word line WL is set as VSS. That is, a difference in potential between a control gate and a channel is increased. As a result, electrons are injected into a charge storage layer, and thus a threshold value of the memory cell transistor MT is increased.

In the NAND string 16 corresponding to the bit line BL("1"), the select transistor ST1 is set to be in a cut-off state. For this reason, the channel of the memory cell transistor MT connected to the selected word line WL is set to be in an electrically floating state. Accordingly, a channel potential rises to, for example, the vicinity of the voltage VPGM by capacity coupling with the word line WL and the like. That is, a difference in potential between a control gate and a channel is reduced. As a result, electrons are not injected in to the charge storage layer, and the threshold value of the memory cell transistor MT is substantially maintained (the threshold value does not fluctuate to such an extent that a threshold voltage value distribution level transitions to a higher threshold voltage distribution level).

At the time t5, recovery processing is performed, and the control circuit 21 terminates the first programming.

Next, the first verification will be described. At the time t6, the control circuit 21 sets the signal STL to be at "H" level for a preset period of time to store data of "1" in the latch circuit SDL. More specifically, the control circuit 21 sets the signal LPC to be at "H" level to set the transistor 31 to be in an on state in the LBUS precharge circuit 30, and applies the voltage VHLB, which is set to be at "H" level, to the bus LBUS. In this state, the control circuit 21 sets the signal SLL to be at "H" level to set the transistor 66 to be in an off state, and then sets the signal STL to be at "H" level to set the transistor 60 to be in an on state, thereby setting the node LAT_S to be at "H" level. Thereafter, the control circuit sets the signals LPC, STL, and SLL to be at "L" level. Thereby, the latch circuit SDL stores data of "1".

At the time t7, the control circuit 21 sets the signal BLC to be at "H" level, and applies a voltage "VBL2+Vth" to the gate of the transistor 41. Between the voltage VBL2 and the voltage VDDSA, a relationship of VDDSA>VBL2 is established. In addition, the control circuit 21 sets the signal BLS and the signal BLX (not illustrated in the drawing) at "H" level to set the transistor 40 and the transistor 42 in an on state. Accordingly, the sense amplifier 13 applies the voltage VBL2 clamped by the transistor 41 to the bit line BL.

The source line driver 15 applies a voltage VSRC2 (>VSS) to the source line SL. The row decoder 12 applies a voltage VSGD3 to the selected gate line SGD of the selected block BLK, and applies a voltage VSGS1 to the selected gate line SGS. The voltage VSGD3 and the voltage VSGS1 set the select transistors ST1 and ST2 to be in an on state in verification. Between the voltage VSGD3 and the voltage VBL2, a relationship of "VSGD3−Vthsg"≥VBL2 is established. Between the voltage VSGS1 and the voltage VSRC2, a relationship of "VSGS1−Vthsg"≥VSRC2 is established.

The row decoder 12 applies a voltage VCGRV to the selected word line WL, and applies a voltage VREAD to the non-selected word line WL. The voltage VCGRV is set in accordance with read-out data (verification level). The voltage VREAD sets the memory cell transistor MT to be in an on state, regardless of the threshold voltage of the memory cell transistor MT. Between the voltage VCGRV and the voltage VREAD, a relationship of VCGRV<VREAD is established.

First, the control circuit 21 sets the signal HLL (not illustrated in the drawing) to be at "H" level to set the transistor 45 to be in an on state between the time t7 and the time t8, and charges the node SEN with the voltage VSENP. After the signal HLL is set to be at "L" level, the control circuit 21 sets the signal XXL (not illustrated in the drawing) to be at "H" level to set the transistor 44 to be in an on state. Thereby, the voltage of the node SEN fluctuates in accordance with the state of the memory cell transistor MT which is a target for verification. More specifically, when the threshold voltage of the memory cell transistor MT which is a target for verification is equal to or higher than a verification level, the memory cell transistor MT is set to be in an off state (hereinafter, referred to as an "OFF-cell"). Accordingly, a current hardly flows to the source line SL from the corresponding bit line BL. That is, the potential of the node SEN is substantially maintained. On the other hand, when the threshold voltage of the memory cell transistor MT which is a target for verification is less than the verification level, the memory cell transistor MT is set to be in an on state (hereinafter, referred to as an "ON-cell"). Accordingly, a current flows to the source line SL from the corresponding bit line BL. That is, the voltage of the node SEN drops.

At the time t8, the control circuit 21 sets the signal STB to be at "H" level for a preset period of time to set the transistor 48 to be in an on state, thereby performing strobing of data. When the voltage of the node SEN is lower than the threshold voltage of the transistor 47 (in a case of an ON-cell), the transistor 47 is set to be in an off state. In this case, the latch circuit ADL maintains data. In addition, when the voltage of the node SEN is equal to or higher than the threshold voltage of the transistor 47 (in a case of an OFF-cell), the transistor 47 is set to be in an on state. In this case, the latch circuit ADL stores data of "0". More specifically, for example, the control circuit 21 sets the signal ALL to be at "H" level to set the transistor 76 to be in an off state, and set the signal ATL to be at "H" level to set the transistor 70 to be in an on state in a state where the transistor 48 is turned on. Then, when the transistor 47 is in an off state (in a case of an ON-cell), the data of the node LAT_A is maintained. On the other hand, when the transistor 47 is in an on state (in a case of an OFF-cell), the node LAT_A is set to be at "L" level. That is, the data of the latch circuit ADL is updated to data of "0". In the sense amplifier unit SAU that performs programming of "0" in the first programming, data of "1" is stored in the latch circuit ADL. Accordingly, the latch circuit ADL stores data of "1" when the threshold voltage of the memory cell transistor MT is less than the verification level (ON-cell) in the programming of "0", and the latch circuit ADL stores data of "0" when the threshold voltage of the memory cell transistor MT is equal to or higher than the verification level (OFF-cell).

At the time t9, the control circuit 21 sets the signal BLC (and signal BLS) to be at "L" level to electrically cut off bit line BL and the sense amplifier 13. In addition, the source line driver 15 applies the voltage VSS to the source line SL. The row decoder 12 applies the voltage VSS to the word line WL and the selected gate lines SGD and SGS.

As a result, the bit line BL is discharged, and the voltage of the bit line BL is lowered to the voltage VSS drops to the voltage VSS between the time t9 and the time t10. The word line WL has a charge capacitance larger than that of the bit line BL, and thus is discharged to drop to the voltage VSS between the time t9 and the time t11.

At the time t10, the control circuit 21 starts BL precharging for the second programming. Specifically, the control circuit 21 sets the signal BLC to be at "H" level to apply a voltage "VBL1+Vth" to the gate of the transistor 41, similar to the time t1. Since data of "1" is stored in all of the latch circuits SDL, the sense amplifier 13 applies the voltage VBL1 to all of the bit lines BL. In addition, the source line driver 15 applies the voltage VSRC1 to the source line SL. The row decoder 12 applies the voltage VSGD1 to the selected gate line SGD of the selected block BLK, and applies the voltage VSS to the selected gate line SGS.

The control circuit 21 sequentially performs Scan<0> to Scan<7> between the time t10 and the time t11. Pieces of data stored in the latch circuits SDL<0> to SDL<7> are sequentially updated in accordance with the scanning. More specifically, as illustrated in FIG. 7, the control circuit 21 first sets the signal STL (or the signal STI) of the latch circuit SDL<0> to be at "H" level for a preset period of time to take inverted data of the latch circuit ADL<0>, that is, the next programming data in the latch circuit SDL<0>. Similarly, the control circuit 21 sequentially takes the pieces of inverted data of the latch circuits ADL<1> to ADL<7> in the latch circuits SDL<1> to SDL<7>.

For example, when data stored in the latch circuit SDL is updated from data of "1" to data of "0", the node LAT_S changes from "H" level to "L" level. That is, the node INV_S changes from "L" level to "H" level. For this reason, the sense amplifier unit SAU changes a voltage to be applied to the corresponding bit line BL from the voltage VBL1 to the voltage VSS. On the other hand, when data stored in the latch circuit SDL is data of "1", the sense amplifier unit SAU subsequently applies the voltage VBL1 to the corresponding bit line BL. Alternatively, scanning may be started between the time t9 and the time t10, that is, during the discharging of the bit line BL.

The scanning is terminated at the time t11. Thus, when it is determined that the control circuit 21 performs the second programming, the row decoder 12 applies the voltage VSGD2 to the selected gate line SGD, similar to the time t2. On the other hand, when it is determined that the control circuit 21 terminates the write operation, recovery processing is performed.

Voltages of wirings at the times t13 to t16 are the same as those at the times t3 to t6.

Meanwhile, time intervals between the times t1 to t16 are not limited to any particular durations.

1.2.3 With Regard to Specific Example of Scanning

Next, a description will be given of specific examples of pieces of data stored in the latch circuits SDL and ADL and voltages of the bit lines BL in scanning.

1.2.3.1 With Regard to Specific Example of Data Stored in Latch Circuit

Specific examples of pieces of data stored in the latch circuits SDL and ADL in a write operation of data will be described with reference to FIGS. 8 and 9. FIGS. 8 and 9 illustrate pieces of data stored in the latch circuits SDL and ADL in first programming and verification. Meanwhile, in the examples in FIGS. 8 and 9, latch circuits SDLi and ADLi corresponding to bit lines BLi (i=0, 1, 2, 3, 7, 8, 9, and (N−1)) are illustrated. In addition, a data line IO indicates the number of a data line IO to which a sense amplifier unit SAUi corresponding to a bit line BLi is connected through a latch circuit XDLi. In addition, in the examples in FIGS. 8 and 9, a latch circuit in which data is updated is illustrated as a hatched portion.

First, as illustrated in a table (A) in FIG. 8, the control circuit 21 stores inverted data of the latch circuit XDL in the latch circuit ADL, and stores inverted data (programming data) of the latch circuit ADL in the latch circuit SDL. In the example of the table (A), data of "1" is stored in the latch circuits SDL1, SDL7, and SDL(N−1), and data of "0" is stored in the latch circuits SDL1, SDL2, SDL3, SDL8, and SDL9. The control circuit 21 performs the first programming in accordance with the data of the latch circuit SDL. That is, programming of "1" is performed in the sense amplifier unit SAU corresponding to data of "1", and programming of "0" is performed in the sense amplifier unit SAU corresponding to data of "0".

Next, as illustrated in a table (B), the control circuit 21 stores data of "1" in all of the latch circuits SDL, and starts first verification.

Next, as illustrated in a table (C), the data of the latch circuit ADL is updated as a result of strobing. Specifically, in the latch circuit ADL corresponding to an OFF-cell (memory cell transistor MT that passes verification) of programming of "0", data of "1" is updated to data of "0". On the other hand, the other latch circuits maintain the data stored therein. In the example of the table (C), data of "1" is updated to data of "0" in the latch circuits SDL2 and SDL9. Thereafter, the control circuit 21 starts charging and discharging of the bit line BL and starts scanning.

As illustrated in a table (D_0) in FIG. 9, first, the control circuit 21 performs Scan<0>. That is, the control circuit 21 stores inverted data of the latch circuit ADL<0> in the latch circuit SDL<0>. The sense amplifier unit SAU<0> applies a voltage to the bit line BL based on updated data stored in the latch circuit SDL<0>. In the example of the table (D_0), data of "1" is stored in the latch circuit SDL0, and data of "0" is stored in the latch circuit SDL8 by the Scan<0>.

Next, as illustrated in a table (D_1), the control circuit 21 performs Scan<1>. In the example of the table (D_1), data of "0" is stored in the latch circuit SDL1, and data of "1" is stored in the latch circuit SDL9 by the Scan<1>.

Next, as illustrated in a table (D_2), the control circuit 21 performs Scan<2>. In the example of the table (D_2), "1" is stored in the latch circuit SDL2 by the Scan<2>.

Next, as illustrated in a table (D_3), the control circuit 21 performs Scan<3>. In the example of the table (D_3), data of "0" is stored in the latch circuit SDL3 by the Scan<3>.

Similarly, the control circuit 21 performs Scan<4> to Scan<6> (not illustrated in the drawing). Thereafter, as illustrated in a table (D_7), the control circuit 21 performs Scan<7>. In the example of the table (D_7), data of "1" is stored in the latch circuit SDL7 and the latch circuit SDL (N−1) by the Scan<7>. Thereby, the scanning is terminated, and thus the voltage VBL1 is applied to the bit lines BL1, BL3, and BL8, and the voltage VSS is applied to the bit lines BL0, BL2, BL7, BL9, and BL(N−1).

When the control circuit 21 determines that second programming is necessary after the scanning is terminated, the row decoder 12 applies the voltage VPGM to the selected word line WL.

Figure 10:
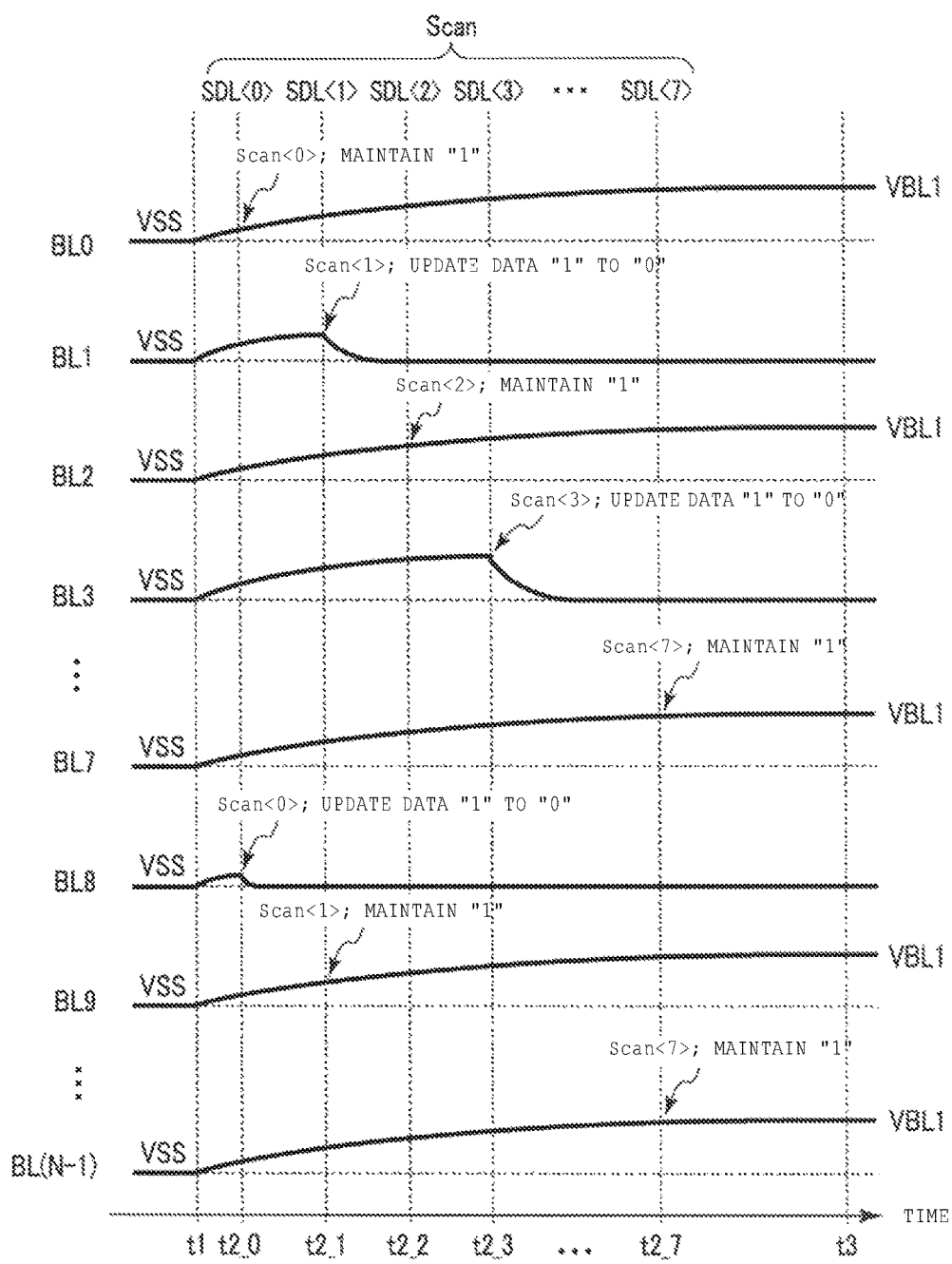
FIG. 10 is a timing chart illustrating an example of potentials of bit lines of the semiconductor memory device according to the first embodiment during a pre-charging operation.

1.2.3.2 With Regard to Specific Example of Fluctuation in Voltage of Bit Line by Scanning Next, a specific example of a fluctuation in a voltage of the bit line BL by scanning will be described with reference to FIG. 10. FIG. 10 illustrates voltages of the bit lines BL during the BL precharging in FIG. 9.

As illustrated in FIG. 10, the sense amplifier 13 starts BL precharging at time t1. That is, the voltage VBL1 is applied to the bit lines BL.

At time t2_0, the control circuit 21 performs Scan<0>. As a result, the latch circuit SDL0 maintains data of "1", and the latch circuit SDL8 is updated from data of "1" to data of "0". Accordingly, the sense amplifier unit SAU0 subsequently applies the voltage VBL1 to the bit line BL0, and the sense amplifier unit SAU8 applies the voltage VSS to the bit line BL8.

At time t2_1, the control circuit 21 performs Scan<1>. As a result, the latch circuit SDL1 is updated from data of "1" to data of "0", and the latch circuit SDL9 maintains data of "1". Accordingly, the sense amplifier unit SAU1 applies the voltage VSS to the bit line BL1, and the sense amplifier unit SAU9 subsequently applies the voltage VBL1 to the bit line BL9.

At time t2_2, the control circuit 21 performs Scan<2>. As a result, the latch circuit SDL2 maintains data of "1". Accordingly, the sense amplifier unit SAU2 subsequently applies the voltage VBL1 to the bit line BL2.

At time t2_3, the control circuit 21 performs Scan<3>. As a result, the latch circuit SDL3 is updated from data of "1" to data of "0". Accordingly, the sense amplifier unit SAU3 applies the voltage VSS to the bit line BL3.

Similarly, the control circuit 21 performs Scan<4> to Scan<6>. Thereafter, the control circuit 21 performs Scan<7> at time t2_7. As a result, the latch circuits SDL7 and SDL (N−1) maintain data of "1". Accordingly, the sense amplifier units SAU7 and SAU(N−1) subsequently apply the voltage VBL1 to the bit line BL7 and the bit line BL(N−1).

Therefore, the voltage VBL1 is applied to the bit lines BL0, BL2, BL7, BL9, and BL(N−1), and the voltage VSS is applied to the bit lines BL1, BL3, and BL8.

At time t3, the BL precharging is completed.

1.3 With Regard to Effects According to this Embodiment

With the configuration according to this embodiment, it is possible to improve processing capability of the semiconductor memory device. Hereinafter, the effects will be described.

In a write operation, scanning of verification is terminated in programming after the verification, that is, the second programming and the subsequent programmings. Thus, the next programming is started after the next programming data is stored in the latch circuits SDL of all of the target sense amplifier units SAU. That is, BL precharging of the next programming is often started after scanning is terminated.

On the other hand, in the configuration according to this embodiment, BL precharging for the next programming is performed in parallel with scanning. Data of the latch circuit SDL is sequentially updated in accordance with scanning, that is, the next programming data is sequentially stored in the latch circuit SDL, and a voltage value to be applied to the corresponding bit line BL is updated. Thereby, it is possible to start BL precharging without waiting for the termination of the scanning. Therefore, it is possible to reduce a processing time in the programming after the verification.

Accordingly, it is possible to improve processing capability of the semiconductor memory device.

Further, in the configuration according to this embodiment, it is possible to reduce a time of BL precharging. Hereinafter, the effects will be described.

For example, when a voltage to be applied for each bit line BL is different, more specifically, when the voltage VSS is applied to the bit line BL("0") and the precharge voltage VBL1 is applied to the bit line BL("1") from a state where the voltage VSS is applied to the bit line BL, a charge capacitance of the bit line BL increases due to the influence of parasitic capacitance between the bit line BL("0") and the bit line BL("1"), which results in an increase in a charging time. In addition, a peak current during the charging of the bit line BL is increased.

On the other hand, in the configuration according to this embodiment, it is possible to apply the same voltage (voltage VBL1) to all of the bit lines BL when BL precharging is started. Thereby, the influence of parasitic capacitance can be reduced, and thus charging corresponding to the parasitic capacitance is not required, thereby allowing a charging time to be reduced. Accordingly, it is possible to improve processing capability of the semiconductor memory device.

Further, a charge capacitance can be reduced when the voltage VBL1 is applied to the bit line BL, and thus it is possible to prevent an increase in a peak current during charging. Accordingly, it is possible to reduce power consumption of the semiconductor memory device.

2. Second Embodiment

Next, a second embodiment will be described. The second embodiment is different from the first embodiment in that a sense amplifier 13 starts BL precharging in a state where each latch circuit SDL stores data of "0". Hereinafter, only differences from the first embodiment will be described.

2.1 With Regard to Overall Flow of Write Operation

Figure 11:
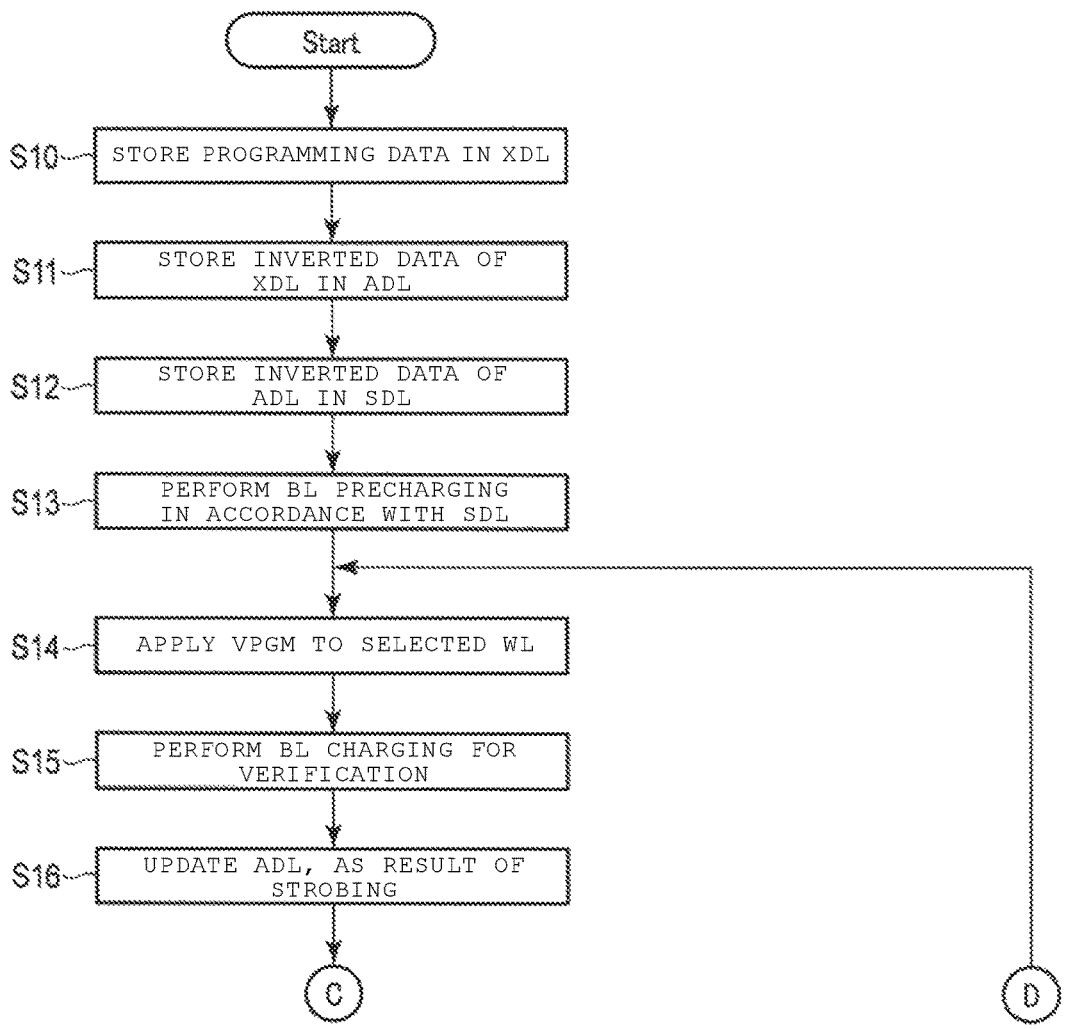
FIGS. 11-12 are flow charts illustrating a write operation of a semiconductor memory device according to a second embodiment.
Figure 12:
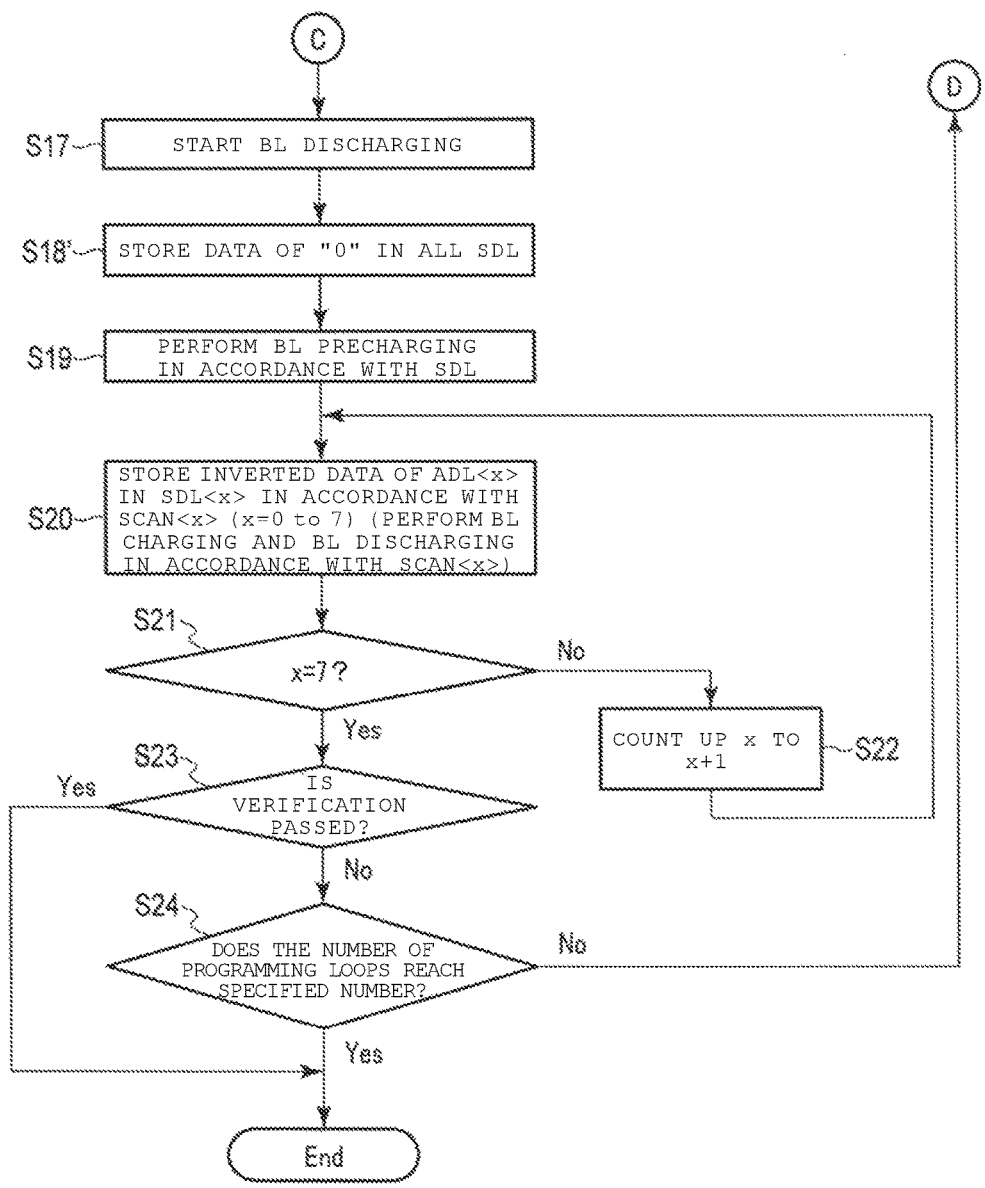

First, the overall flow of a write operation will be described with reference to FIGS. 11 and 12.

As illustrated in the drawing, operations in steps S10 to S17 and steps S20 to S24 in this embodiment are the same as those in FIGS. 4 and 5 of the first embodiment.

In this embodiment, a control circuit 21 stores data of "0" in all latch circuits SDL (step S18') after BL discharging is started (step S17) in order to prevent a voltage VBL1 from not being applied to a bit line BL before scanning is started. More specifically, the control circuit 21 stores data of "0" in all latch circuits SDL before BL precharging of programming is started after the discharging of the bit line BL is started, that is, a sense amplifier unit SAU and the bit line BL are electrically cut off.

Next, a sense amplifier 13 starts BL precharging in accordance with data of the latch circuit SDL for programming (step S19). More specifically, the sense amplifier 13 applies a voltage VSS to the bit line BL in accordance with data of "0" of the latch circuit SDL.

2.2 With Regard to Voltages of Wirings in Write Operation

Figure 13:
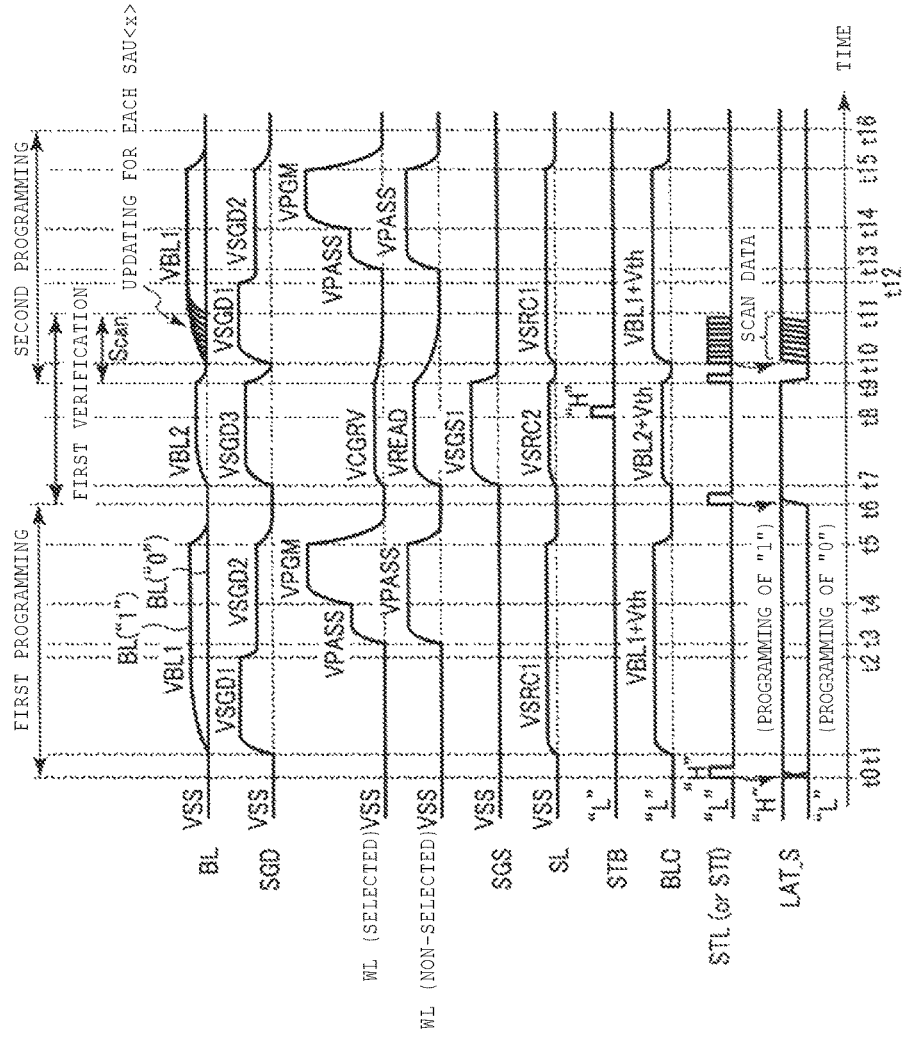
FIG. 13 is a timing chart illustrating potentials of wirings of the semiconductor memory device according to the second embodiment during a write operation.

Next, voltages of wirings in programming will be described with reference to FIG. 13. FIG. 13 illustrates changes in voltages of wirings in first programming, first verification, and second programming, similar to FIG. 6 of the first embodiment. In addition, an example in FIG. 13 shows a case where scanning is started after BL precharging is started. Hereinafter, only differences from FIG. 6 of the first embodiment will be described.

As illustrated in the drawing, voltages of wirings at times t0 to t9 are the same as those in FIG. 6 of the first embodiment.

At the time t9, the control circuit 21 sets a signal STI to be at "H" level for a preset period of time to store data of "0" in the latch circuit SDL. More specifically, the control circuit 21 sets a signal LPC to be at "H" level to set a transistor 31 to be in an on state in a LBUS precharge circuit 30, and applies a voltage VHLB, which is set to be at "H" level, to a bus LBUS. In this state, the control circuit 21 sets a signal SLI to be at "H" level to set a transistor 67 to be in an off state, and then sets a signal STI to be at "H" level to set a transistor 61 to be in an on state, thereby setting a node INV_S to be at "H" level. Thereafter, the control circuit 21 sets the signals LPC, STI, and SLI to be at "L" level. Thereby, the latch circuit SDL stores data of "0".

At the time t10, the control circuit 21 subsequently starts BL precharging for programming. In this embodiment, data of "0" is stored in all latch circuits SDL, and thus the sense amplifier 13 applies the voltage VSS to all of the bit lines BL.

The control circuit 21 sequentially performs Scan<0> to Scan<7> between the time t10 and the time t11, similar to the description of FIG. 7. Pieces of data stored in latch circuits SDL<0> to SDL<7> are sequentially updated in accordance with scanning. When data stored in the latch circuit SDL is updated from data of "0" to data of "1", the node INV_S changes from "H" level to "L" level. For this reason, the sense amplifier unit SAU changes a voltage to be applied to the corresponding bit line BL from the voltage VSS to the voltage VBL1.

Voltages of wirings at times t11 to t16 are the same as those in FIG. 6.

2.3.1 With Regard to Specific Example of Scanning

Next, a description will be given of specific examples of pieces of data stored in the latch circuits SDL and ADL and voltages of the bit lines BL in scanning.

2.3.1 With Regard to Specific Example of Data Stored in Latch Circuit

Specific examples of pieces of data stored in the latch circuits SDL and ADL in a write operation of data will be described with reference to FIGS. 14 and 15. FIGS. 14 and 15 illustrate pieces of data stored in the latch circuits SDL and ADL in first programming and verification, similar to FIGS. 8 and 9 of the first embodiment. Hereinafter, only differences from FIGS. 8 and 9 will be described.

As illustrated in a table (A) and a table (B) in FIG. 14, pieces of data stored in the latch circuits SDL and ADL are the same as those of the tables (A) and (B) in FIG. 8.

As illustrated in a table (C), data of the latch circuit ADL is updated as a result of strobing. In the example of the table (C), data of "1" is updated to data of "0" in latch circuits SDL1, SDL2 and SDL8. In addition, the control circuit 21 stores data of "0" in all of the latch circuits SDL. Thereafter, the control circuit 21 starts charging and discharging of the bit line BL and starts scanning.

As illustrated in a table (D_0) in FIG. 15, first, the control circuit 21 performs Scan<0>. In the example of the table (D_0), data of "1" is stored in the latch circuits SDL0 and SDL8 by Scan<0>.

Next, as illustrated in a table (D_1), the control circuit 21 performs Scan<1>. In the example of the table (D_1), data of "1" is stored in the latch circuit SDL1 by Scan<1>, and data of "0" is stored in the latch circuit SDL9.

Next, as illustrated in a table (D_2), the control circuit 21 performs Scan<2>. In the example of the table (D_2), "1" is stored in the latch circuit SDL2 by Scan<2>.

Next, as illustrated in a table (D_3), the control circuit 21 performs Scan<3>. In the example of the table (D_3), data of "0" is stored in the latch circuit SDL3 by Scan<3>.

Similarly, the control circuit 21 performs Scan<4> to Scan<6> (not illustrated in the drawing). Thereafter, as illustrated in a table (D_7), the control circuit 21 performs Scan<7>. In the example of the table (D_7), data of "1" is stored in the latch circuit SDL7 and the latch circuit SDL (N−1) by the Scan<7>. Thereby, the scanning is terminated, and thus the voltage VBL1 is applied to the bit lines BL3 and BL9, and the voltage VSS is applied to the bit lines BL0 to BL2, BL7, BL8, and BL(N−1).

When the control circuit 21 determines that second programming is necessary after the scanning is terminated, the row decoder 12 applies a voltage VPGM to the selected word line WL.

Figure 16:
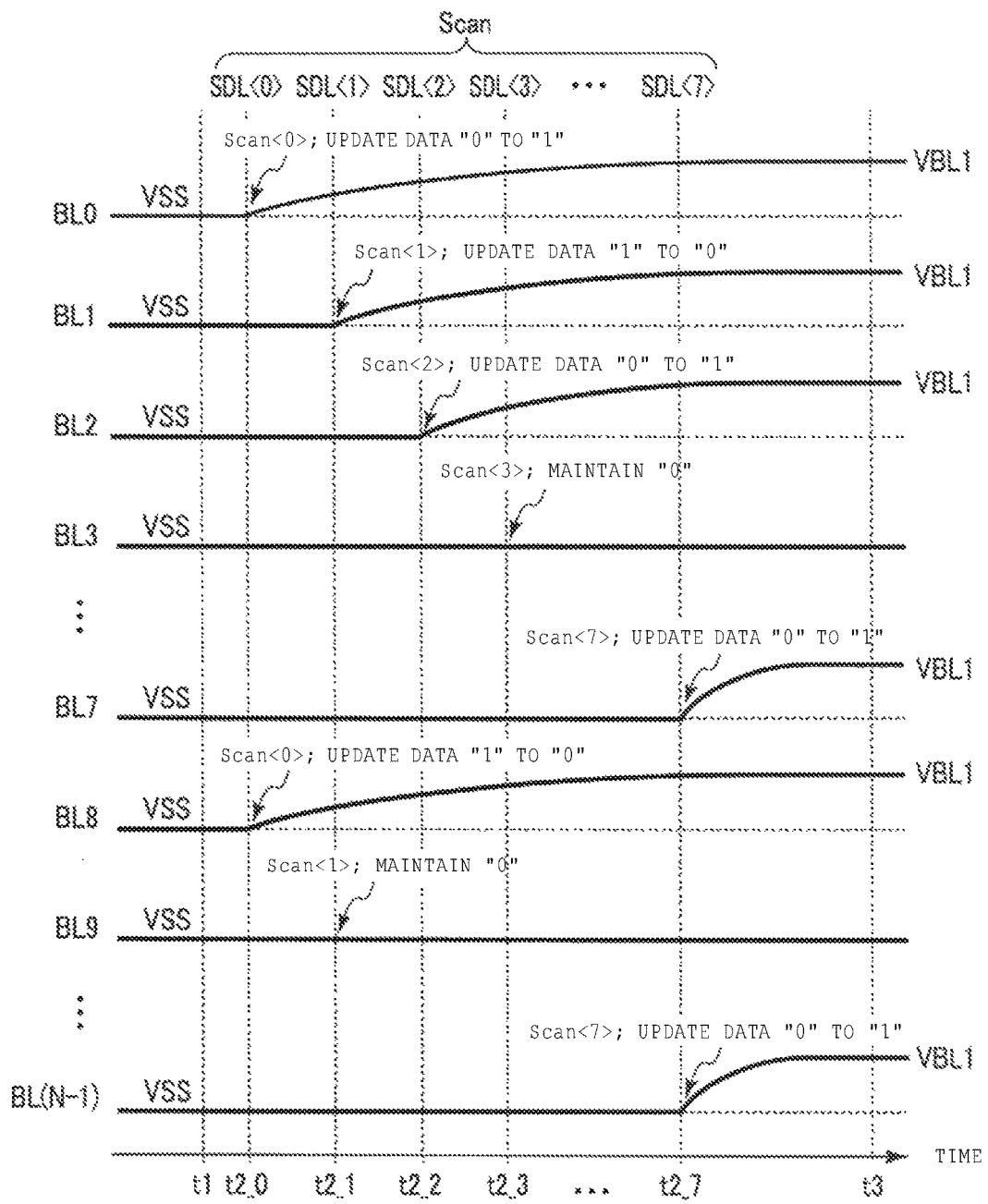
FIG. 16 is a timing chart illustrating an example of potentials of bit lines of the semiconductor memory device according to the second embodiment during a pre-charging operation.

2.3.2 With Regard to Specific Example of Fluctuation in Voltage of Bit Line by Scanning Next, a specific example of a fluctuation in a voltage of the bit line BL by scanning will be described with reference to FIG. 16. FIG. 16 illustrates voltages of the bit lines BL during the BL precharging in FIG. 15.

As illustrated in FIG. 16, the sense amplifier 13 starts BL precharging at time t1. That is, the voltage VSS is applied to the bit lines BL.

At time t2_0, the control circuit 21 performs Scan<0>. As a result, the latch circuits SDL0 and SDL8 are updated from data of "0" is updated to data of "1". Accordingly, the sense amplifier units SAU0 and SAU8 apply the voltage VBL1 to the bit lines BL0 and BL8.

At time t2_1, the control circuit 21 performs Scan<1>. As a result, the latch circuit SDL1 is updated from data of "0" to data of "1", and the latch circuit SDL9 maintains data of "0". Accordingly, the sense amplifier unit SAU1 applies the voltage VBL1 to the bit line BL1, and the sense amplifier unit SAU9 subsequently applies the voltage VSS to the bit line BL9.

At time t2_2, the control circuit 21 performs Scan<2>. As a result, the latch circuit SDL2 is updated from data of "0" to data of "1". Accordingly, the sense amplifier unit SAU2 applies the voltage VBL1 to the bit line BL2.

At time t2_3, the control circuit 21 performs Scan<3>. As a result, the latch circuit SDL3 maintains data of "0". Accordingly, the sense amplifier unit SAU3 subsequently applies the voltage VSS to the bit line BL3.

Similarly, the control circuit 21 performs Scan<4> to Scan<6>. Thereafter, at time t2_7, the control circuit 21 performs Scan<7>. As a result, the latch circuits SDL7 and SDL(N−1) are updated from data of "0" to data of "1". Accordingly, the sense amplifier units SAU7 and SAU(N−1) apply the voltage VBL1 to the bit line BL7 and the bit line BL(N−1).

Therefore, the voltage VBL1 is applied to the bit lines BL0 to BL2, BL7, BL8, and BL (N−1), and the voltage VSS is applied to the bit lines BL3 and BL9.

At time t3, BL precharging is completed.

2.4 With Regard to Effects According to This Embodiment

With the configuration according to this embodiment, it is possible to obtain the same effects as those in the first embodiment.

Further, in the configuration according to this embodiment, the precharge voltage VBL1 is applied to the bit line BL after data of the latch circuit SDL is updated from data of "0" to data of "1" by scanning. For this reason, a timing of the start of the charging of the bit line BL with the voltage VBL1 varies depending on scanning. Accordingly, it is possible to reduce a peak current during BL precharging.

3. Third Embodiment

Next, a third embodiment will be described. The third embodiment is different from the first embodiment in that BL precharging of second programming is started without performing discharging of a bit line BL. Hereinafter, only differences from the first embodiment will be described.

3.1 With Regard to Voltages of Wirings in Write Operation

Figure 17:
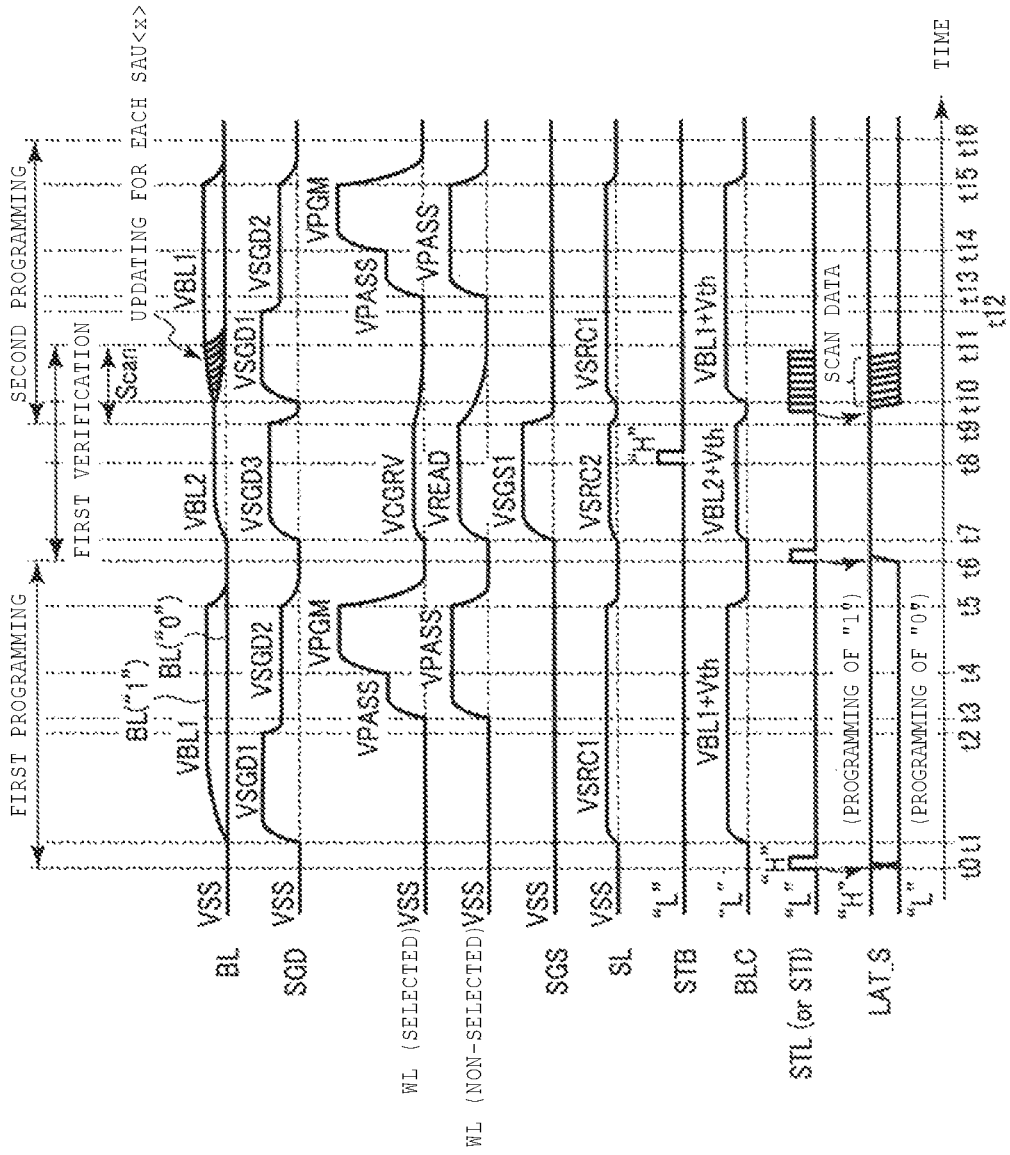
FIG. 17 is a timing chart illustrating potentials of wirings of a semiconductor memory device according to a third embodiment during a write operation.

Voltages of wirings in programming will be described with reference to FIG. 17. FIG. 17 illustrates changes in voltages of wirings in first programming, first verification, and second programming, similar to FIG. 6 of the first embodiment. In addition, an example in FIG. 17 shows a case where scanning is started before BL precharging is started. Hereinafter, only differences from FIG. 6 of the first embodiment will be described.

As illustrated in the drawing, voltages of wirings at times t0 to t9 are the same as those in FIG. 6 of the first embodiment.

At the time t9, a bit line BL maintains a voltage VBL2 without being discharged. For example, in a NAND string 16 which is a target for writing, a select transistor ST1 and a transistor 40 to which a signal BLS of a sense amplifier unit SAU is input are set to be in an off state after a select transistor ST2 is set to be in an off state. Thereby, the channel and the bit line BL of the NAND string 16 are set to be in a floating state, and maintains a voltage VBL2.

A control circuit 21 starts scanning between the time t9 and the time t10, and starts BL precharging at the time t10. More specifically, for example, the control circuit 21 performs Scan<0> between the time t9 and the time t10, and updates data of a latch circuit SDL<0>. At this time, data of "1" is stored in latch circuits SDL<1> to SDL<7>. In this state, the control circuit 21 starts BL precharging. Accordingly, a voltage VSS or a voltage VBL1 is applied to the bit line BL corresponding to the latch circuit SDL<0> in accordance with the data of the latch circuit SDL<0> when BL precharging is started, and the voltage VBL1 is applied to the bit lines BL corresponding to the latch circuits SDL<1> to SDL<7>. In addition, Scan<1> to Scan<7> are performed between the time t10 and the time t11.

Voltages of wirings in times t11 to t16 are the same as those in FIG. 6.

3.2 With Regard to Effects According to this Embodiment

With the configuration according to this embodiment, it is possible to obtain the same effects as those in the first embodiment.

Further, in the configuration according to this embodiment, it is possible to start BL precharging without performing discharging of the bit line BL. For this reason, a discharging time of the bit line BL can be saved, and thus it is possible to reduce a processing time. Accordingly, it is possible to improve processing capability of the semiconductor memory device.

Further, when the voltage VBL1 is applied to the bit line BL in BL precharging, the increase of a voltage may be started from the voltage VBL2 (>VSS), and thus it is possible to reduce a charging time of the bit line BL. Further, it is possible to reduce a peak current during BL precharging.

Meanwhile, in this embodiment, data of "0" may be stored in all of the latch circuits SDL before BL precharging for programming is started, similar to the second embodiment.

4. Fourth Embodiment

Next, a fourth embodiment will be described. In the fourth embodiment, a case where two programming conditions are applied in programming of "0" will be described. Hereinafter, only differences from the first to third embodiments will be described.

4.1 With Regard to Configuration of Sense Amplifier Unit

First, a configuration of a sense amplifier unit SAU will be described with reference to FIG. 18.

Figure 18:
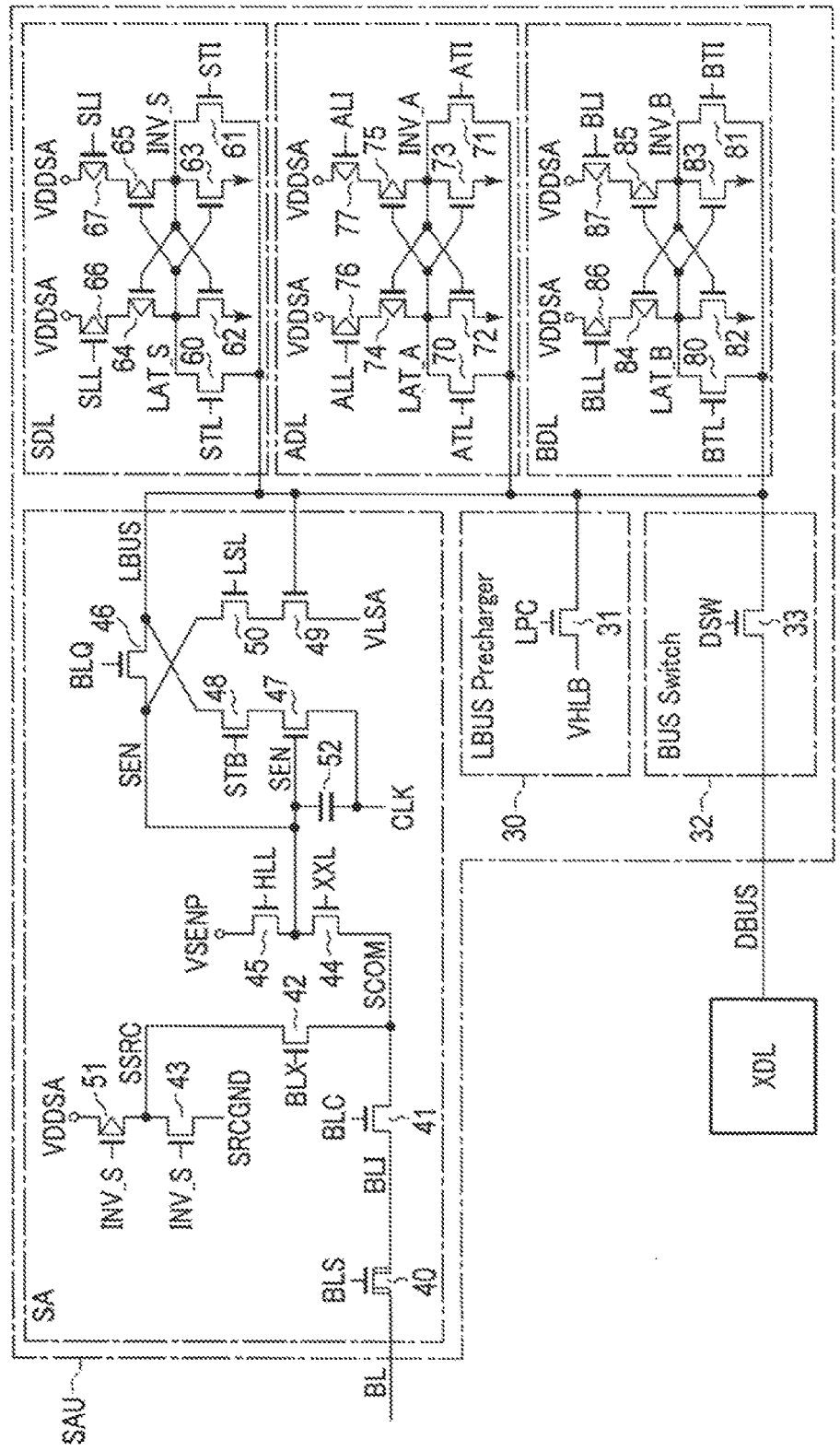
FIG. 18 is a circuit diagram of a sense amplifier unit included in a semiconductor memory device according to a fourth embodiment.

As illustrated in FIG. 18, the sense amplifier unit SAU in this embodiment includes three latch circuits SDL, ADL, and BDL. Circuit configurations of a sense amplifier section SA, a LBUS precharge circuit 30, a BUS switch circuit 32, and the latch circuits SDL and ADL are the same as those in FIG. 3. The latch circuit BDL has the same circuit configuration as those of the latch circuits SDL and ADL. Accordingly, although its description is omitted, the transistors and names of signals thereof will be distinguished from those of the latch circuits SDL and ADL illustrated in FIG. 18. Transistors 80 to 87 of the latch circuit BDL are equivalent to transistors 60 to 67 of the latch circuit SDL, respectively.

4.2 With Regard to Write Operation

Next, a write operation of data will be described. In this embodiment, either a first programming condition causing a relatively large amount of fluctuation in a threshold voltage or a second programming condition causing a smaller amount of fluctuation in a threshold voltage than that of the first programming condition is applied in accordance with a difference between a target verification level and a threshold voltage of a memory cell transistor MT in programming of "0". For example, when the threshold voltage of the memory cell transistor MT is sufficiently lower than a verification level and does not reach a target verification level in first programming, the first programming condition causing a relatively large amount of fluctuation in a threshold voltage is applied. In addition, when the threshold voltage of the memory cell transistor MT is relatively close to the target verification level and exceeds the verification level by a significant amount as a result of the first programming condition being applied thereto, the second programming condition is applied.

More specifically, the first programming condition and the second programming condition are different from each other in voltages of bit lines BL. For example, a voltage VSS is applied to the bit line BL corresponding to the first programming condition. A voltage applied to the bit line BL corresponding to the second programming condition is denoted by VQPW. Then, among the voltage VSS, the voltage VQPW, and a voltage VBL1, a relationship of VBL1>VQPW>VSS is established.

Hereinafter, a bit line having the first programming condition applied thereto is denoted by BL("0"), and a bit line having the second programming condition applied thereto is denoted by BL("QPW") in programming of "0".

In addition, in this embodiment, first and second verifications having different target levels are performed after programming. In the first verification, a first verification voltage (hereinafter, referred to as a "voltage VL") which is lower than a verification level is set as a target level. In the second verification, for example, a second verification voltage (hereinafter, referred to as a "voltage VH") which is the same as the verification level is set. When the first verification is failed (threshold voltage<VL), the first programming condition is applied in the next programming. When the first verification is passed and the second verification is failed (VL≤threshold voltage<VH), the second programming condition is applied in the next programming. When the second verification is passed (VH≤threshold voltage), writing is inhibited in the subsequent programming.

4.3 With Regard to Overall Flow of Write Operation

Figure 19:
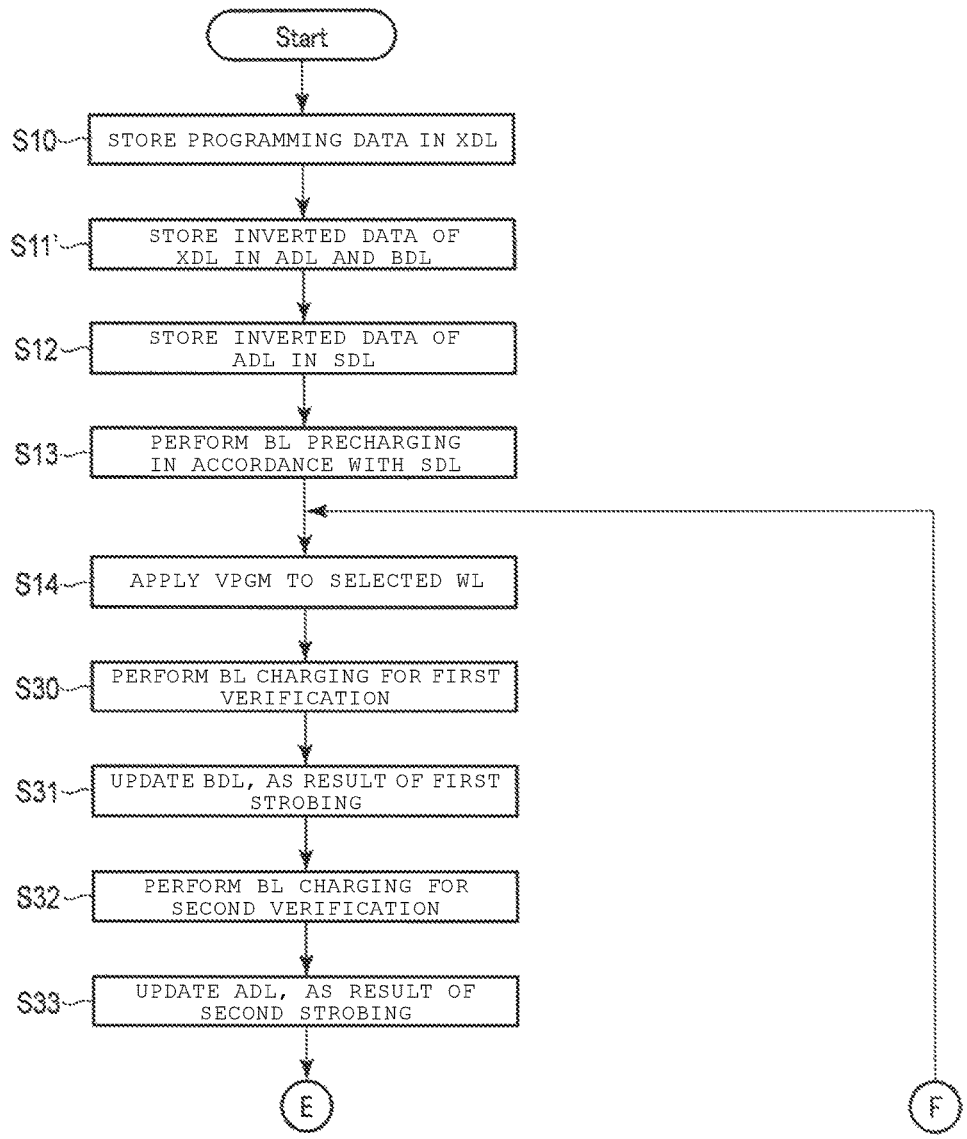
FIGS. 19-20 are flow charts illustrating a write operation of the semiconductor memory device according to the fourth embodiment.
Figure 20:
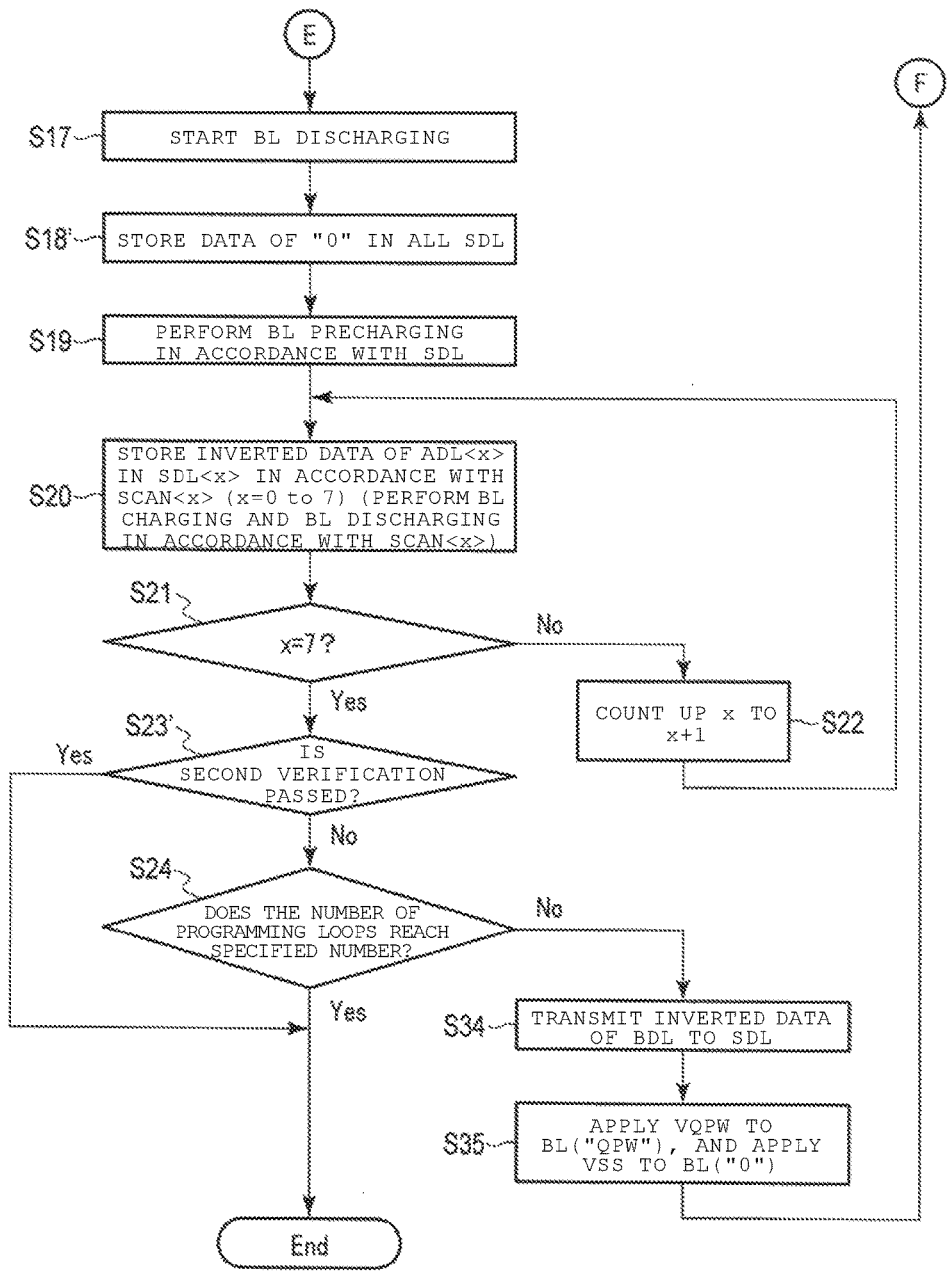

First, the overall flow of a write operation will be described with reference to the overall flow. FIGS. 19 and 20 are flow charts illustrating a flow of a write operation.

As illustrated in the drawing, first, the control circuit 21 stores programming data received from, for example, an external controller in a latch circuit XDL (step S10).

Next, the control circuit 21 stores inverted data of the programming data, which is stored in the latch circuit XDL, in latch circuits ADL and BDL (step S11'). Further, the control circuit 21 stores inverted data of the data stored in the latch circuit ADL (or the latch circuit BDL), that is, programming data in a latch circuit SDL (step S12).

Next, the sense amplifier 13 starts BL precharging in accordance with data of the latch circuit SDL for programming (step S13). In the first programming, the second programming condition is not applied, and thus the voltage VSS is applied to the bit line BL("0") in response to data of "0", that is, programming of "0", and a voltage VBL is applied to the bit line BL("1") in response to data of "1", that is, programming of "1" (step S11). Next, the row decoder 12 applies a voltage VPGM to a selected word line WL, and writes data in a target memory cell transistor MT (step S14).

Next, the control circuit 21 starts the first verification, and charges the bit line BL (step S30). At this time, for example, data of "1" is stored in the latch circuit SDL of each sense amplifier unit SAU.

Next, the control circuit 21 performs first strobing to update the latch circuit BDL (step S31). More specifically, in the latch circuit BDL corresponding to programming of "1", data of "0" is maintained. In programming of "0", data of "1" is updated to data of "0" in the latch circuit BDL corresponding to the memory cell transistor MT having a threshold voltage of equal to or greater than a voltage VT, that is, the memory cell transistor MT that passes the first verification. In programming of "0", data of "1" is maintained in the latch circuit BDL corresponding to the memory cell transistor MT having a threshold voltage of less than a voltage VL, that is, the memory cell transistor MT that fails in the first verification.

Next, the control circuit 21 starts the second verification and charges the bit line BL (step S32).

Next, the control circuit 21 performs second strobing to update the latch circuit ADL (step S33). More specifically, in the latch circuit ADL corresponding to programming of "1", data of "0" is maintained. In programming of "0", data of "1" is updated to data of "0" in the latch circuit ADL corresponding to the memory cell transistor MT having a threshold voltage of equal to or greater than a voltage VH, that is, the memory cell transistor MT that passes the second verification. In programming of "0", data of "1" is maintained in the latch circuit ADL corresponding to the memory cell transistor MT having a threshold voltage of less than the voltage VH, that is, the memory cell transistor MT that fails in the second verification.

Next, the control circuit 21 starts discharging the bit line BL (step S17).

Next, the control circuit 21 stores data of "0" in all of the latch circuits SDL in order to prevent the voltage VBL1 from not being applied to the bit line BL before scanning is started, similar to the second embodiment (step S18').

Next, the sense amplifier 13 starts BL precharging in accordance with data of the latch circuit SDL for programming (step S19). More specifically, the sense amplifier 13 applies the voltage VSS to the bit line BL in accordance with data of "0" of the latch circuit SDL.

Next, the control circuit 21 starts scanning. In Scan<x>, data of the latch circuit ADL<x> is transmitted to the latch circuit SDL<x> (step S20).

The control circuit 21 repeats the scanning until x=7 is reached in step S20 to 22, similar to the first and second embodiments.

When the scanning is terminated (step S21 Yes), the control circuit 21 determines verification from results of the second verification (step S23'). When the second verification is passed (step S23'_Yes), the control circuit 21 completes the write operation.

On the other hand, when the second verification is failed (step S23'_No), the control circuit 21 confirms the number of programming loops (step S24). When the number of programming loops reaches a specified number which is set in advance (step S24_Yes), the control circuit 21 terminates the write operation and notifies, for example, an external controller that the write operation is not normally terminated. In addition, when the number of programming loops does not reach the specified number (step S24_No), the control circuit 21 performs the next programming.

First, the control circuit 21 transmits inverted data of the latch circuit BDL to the latch circuit SDL (step S34).

Next, the control circuit 21 applies the voltage VQPW to a bit line BL("QPW") in accordance with data of the latch circuit SDL, and applies the voltage VSS to the bit line BL("0"). Thereafter, the control circuit returns to step S14 to apply the voltage VPGM to the selected word line WL.

4.4 With Regard to Voltages of Wirings in Write Operation

Figure 21:
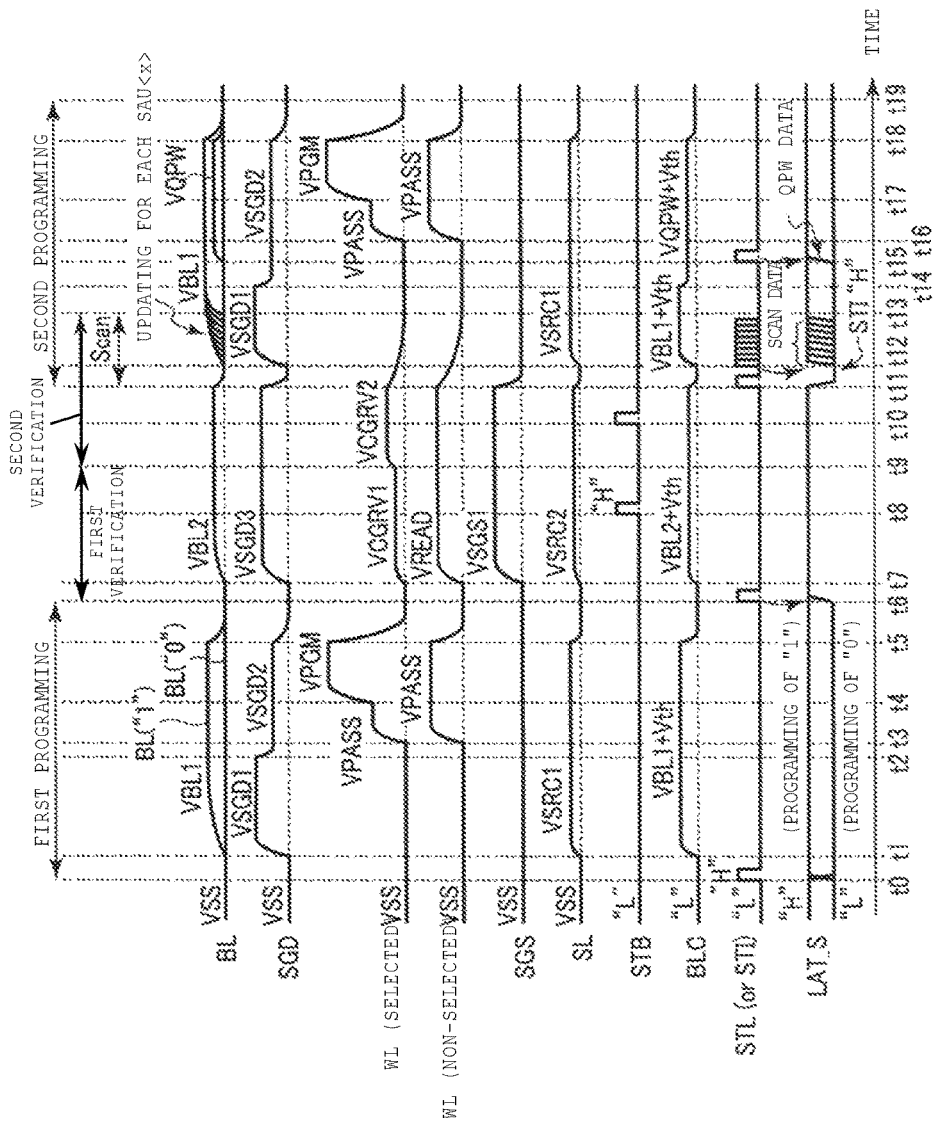
FIG. 21 is a timing chart illustrating potentials of wirings of the semiconductor memory device according to the fourth embodiment during a write operation.

Next, voltages of wirings in programming will be described with reference to FIG. 21. FIG. 21 illustrates changes in voltages of wirings in first programming, first verification, and second programming, similar to FIG. 6 of the first embodiment, FIG. 13 of the second embodiment, and FIG. 16 of the third embodiment. In addition, an example in FIG. 21 shows a case where scanning is started after BL precharging is started. Further, in this embodiment, a case where read-out voltages VCGRV in first and second verifications are different from each other will be described. For example, the row decoder 12 applies a voltage VCGRV1 (=VL) to the selected word line WL in the first verification, and applies a voltage VCGRV2 (=VH) to the selected word line WL in the second verification. Meanwhile, the voltages VCGRV in the first verification and the second verification may be the same voltage. In this case, a sensing period, that is, a period of time for which the bit line BL is sensed by setting a signal XXL I to be at "H" level in the first verification may be different from that in the second verification. Hereinafter, only differences from the first to third embodiments will be described.

As illustrated in the drawing, the first programming is performed between time t0 and time t6, the first verification is performed between the time t6 and time t9, the second verification is performed between the time t9 and time t13, and the second programming is performed between the time t11 and time t19.

Voltages of wirings at the times t0 to t7 are the same as those in FIGS. 6, 13, and 17.

At the time t7, the row decoder 12 applies a voltage VCGRV1 corresponding to the voltage VL to the selected word line WL.

At the time t8, the control circuit 21 sets a signal STB to be at "H" level to set a transistor 48 to be in an on state, thereby performing strobing of data of the first verification. At this time, the control circuit 21 updates, for example, data of the latch circuit BDL. More specifically, for example, the control circuit 21 sets a signal BLL to be at "H" level to set a transistor 86 to be in an off state, and sets a signal BTL to be at "H" level to set a transistor 80 to be in an on state in a state where the transistor 48 is turned on. Then, when a transistor 47 is in an off state (in a case of an ON-cell), data of the node LAT_B is maintained. On the other hand, when the transistor 47 is in an on state (in a case of an OFF-cell), the node LAT_B is set to be at "L" level. That is, the data of the latch circuit BDL is updated to data of "0". In the sense amplifier unit SAU that performs programming of "0" in the first programming, data of "1" is stored in the latch circuit BDL. Accordingly, the latch circuit BDL stores data of "1" when the threshold voltage of the memory cell transistor MT is less than the voltage VL (ON-cell) in programming of "0", and a latch circuit ABL stores data of "0" when the threshold voltage of the memory cell transistor MT is equal to or greater than the voltage VL (OFF-cell).

At the time t9, the row decoder 12 applies a voltage VCGRV2 (>VCGRV1) corresponding to the voltage VH to the selected word line WL.

At the time t10, the control circuit 21 sets the signal STB to be at "H" level to set the transistor 48 to be in an on state, thereby performing strobing of data of the second verification. At this time, the control circuit 21 updates, for example, data of the latch circuit ADL.

At the times t11 to t4, charging and discharging of the bit line BL and scanning are performed, similar to the times t9 to t12 in FIG. 13 of the second embodiment. As a result of the scanning, the voltage VBL1 is applied to the bit line BL("1") corresponding to the first programming condition, and the voltage VSS is applied to the bit line BL("QPW") corresponding to the second programming condition and the bit line BL("1") corresponding to programming of "1".

At the time t14, the row decoder 12 applies a voltage VSGD2 to a selected gate line SGD. In addition, the control circuit 21 sets a voltage of a signal BLC, which is set to be at "H" level, to be "VQPW+Vth". Here, between VSGD2 and VPQW, a relationship of "VSGD2−Vthsg">VQPW is established. As a result, a select transistor ST1 and the transistor 41 of the sense amplifier unit SAU are set to be in a cut-off state, and the bit line BL("1") is set to be in a floating state.

At the time t15, the control circuit 21 transmits inverted data of the latch circuit BDL to the latch circuit SDL. As a result, data of "0" is maintained in the latch circuit SDL corresponding to the first programming condition, and data of "1" is updated to data of "0" in the latch circuit SDL corresponding to the second programming condition. Data of "1" is stored in the latch circuit SDL corresponding to programming of "1". As a result, the voltage VQPW is applied to the bit line BL("QPW"), and the voltage VSS is applied to the bit line BL("0"). Meanwhile, the bit line BL("1") is maintained in a floating state.

At the time t16, the row decoder 12 applies a voltage VPASS to a word line WL of a selected block BLK.

At the time t17, the row decoder 12 applies the voltage VPGM to the selected word line WL. Thereby, data is written in a target memory cell transistor MT. At this time, in the NAND string 16 corresponding to the bit line BL("QPW"), the select transistor ST1 is set to be in an on state. The channel potential of the memory cell transistor MT connected to the selected word line WL is set as VQPW (>VSS). Accordingly, a difference in potential between a control gate and a channel becomes smaller than in a case where the channel potential is VSS. As a result, the amount of electrons injected into the charge storage layer becomes larger than that in the memory cell transistor MT corresponding to the bit line BL("0"), and the amount of fluctuation in the threshold voltage of the memory cell transistor MT is also reduced.

The control circuit 21 performs recovery processing between the time t18 and the time 19, and terminates the second programming.

4.5 With Regard to Specific Example of Scanning

Next, a description will be given of specific examples of pieces of data stored in the latch circuits SDL, ADL, and BDL and voltages of the bit lines BL in scanning.

4.5.1 With Regard to Specific Example of Data Stored in Latch Circuit

Figure 24:
FIG. 24 is a diagram illustrating an example of data stored in latch circuits of the semiconductor memory device according to the fourth embodiment following the scanning operation.

Specific examples of pieces of data stored in the latch circuits SDL, ADL, and BDL in a write operation of data will be described with reference to FIGS. 22 to 24. FIGS. 22 to 24 illustrate pieces of data stored in the latch circuits ADL, BDL, and SDL in first programming and verification. Hereinafter, only differences from the first and second embodiments will be described.

First, as illustrated in a table (A) in FIG. 22, the control circuit 21 stores inverted data of the latch circuit XDL in the latch circuits ADL and BDL, and stores inverted data (programming data) of the latch circuit ADL (or the latch circuit BDL) in the latch circuit SDL. In the example of the table (A), data of "1" is stored in latch circuits SDL1, SDL7, and SDL(N-1), and data of "0" is stored in latch circuits SDL1, SDL2, SDL3, SDL8, and SDL9. Thereafter, the control circuit 21 performs the first programming in accordance with the data of the latch circuit SDL.

Next, as illustrated in a table (B), the control circuit 21 stores data of "1" in all of the latch circuits SDL, and starts first verification.

Next, as illustrated in a table (C), the data of the latch circuit BDL is updated as a result of strobing of the first verification. Specifically, data of "1" is updated to data of "0" in the latch circuit BDL corresponding to an OFF-cell (memory cell transistor MT that passes the first verification) of programming of "0". On the other hand, the other latch circuits maintain the data stored therein. In the example of the table (C), data of "1" is updated to data of "0" in the latch circuits SDL1, SDL2, and SDL8. Thereafter, the control circuit 21 starts second verification.

Next, as illustrated in a table (D), the data of the latch circuit ADL is updated as a result of strobing of the second verification. Specifically, data of "1" is updated to data of "0" in the latch circuit ADL corresponding to an OFF-cell (memory cell transistor MT that passes the second verification) of programming of "0". On the other hand, the other latch circuits maintain the data stored therein. In the example of the table (D), data of "1" is updated to data of "0" in the latch circuit SDL1. Thereafter, charging and discharging of the bit line BL are started, and data of "0" is once stored in all of the latch circuits SDL. Thereafter, the control circuit 21 starts scanning.

As illustrated in a table (E_0) in FIG. 23, first, the control circuit 21 performs Scan<0>. That is, the control circuit 21 stores inverted data of a latch circuit ADL<0> in a latch circuit SDL<0>. A sense amplifier unit SAU<0> applies a voltage to the bit line BL based on updated data stored in the latch circuit SDL<0>. In the example of the table (E_0), data of "1" is stored in the latch circuit SDL0, and data of "0" is stored in the latch circuit SDL8 by the Scan<0>.

Next, as illustrated in a table (E_1), the control circuit 21 performs Scan<1>. In the example of the table (E_1), data of "1" is stored in the latch circuit SDL1, and data of "0" is stored in the latch circuit SDL9 by the Scan<1>.

Next, as illustrated in a table (E_2), the control circuit 21 performs Scan<2>. In the example of the table (E_2), "0" is stored in the latch circuit SDL2 by the Scan<2>.

Next, as illustrated in a table (E_3), the control circuit 21 performs Scan<3>. In the example of the table (E_3), data of "0" is stored in the latch circuit SDL3 by the Scan<3>.

Similarly, the control circuit 21 performs Scan<4> to Scan<6> (not illustrated in the drawing). Thereafter, as illustrated in a table (E_7), the control circuit 21 performs Scan<7>. In the example of the table (E_7), data of "1" is stored in the latch circuit SDL7 and the latch circuit SDL(N-1) by the Scan<7>. Thereby, the scanning is terminated, and thus the voltage VBL1 is applied to the bit lines BL2, BL3, BL8, and BL9, and the voltage VSS is applied to the bit lines BL0, BL1, BL7, and BL(N-1).

When the control circuit 21 determines that second programming is necessary after the scanning is terminated, the control circuit 21 transmits inverted data of the latch circuit BDL to the latch circuit SDL, as illustrated in a table (G) in FIG. 24. In the example of the table (G), data of "1" is stored in the latch circuits SDL0 to SDL2, SDL7, SDL8, and SDL(N-1), and data of "0" is stored in the latch circuits SDL3 and SDL9. In addition, the voltage VQPW is applied to the bit lines BL2 and BL8, and the voltage VSS is applied to the bit lines BL3 and BL9. Thereafter, the row decoder 12 applies the voltage VPGM to the selected word line WL, thereby performing the second programming.

Figure 25:
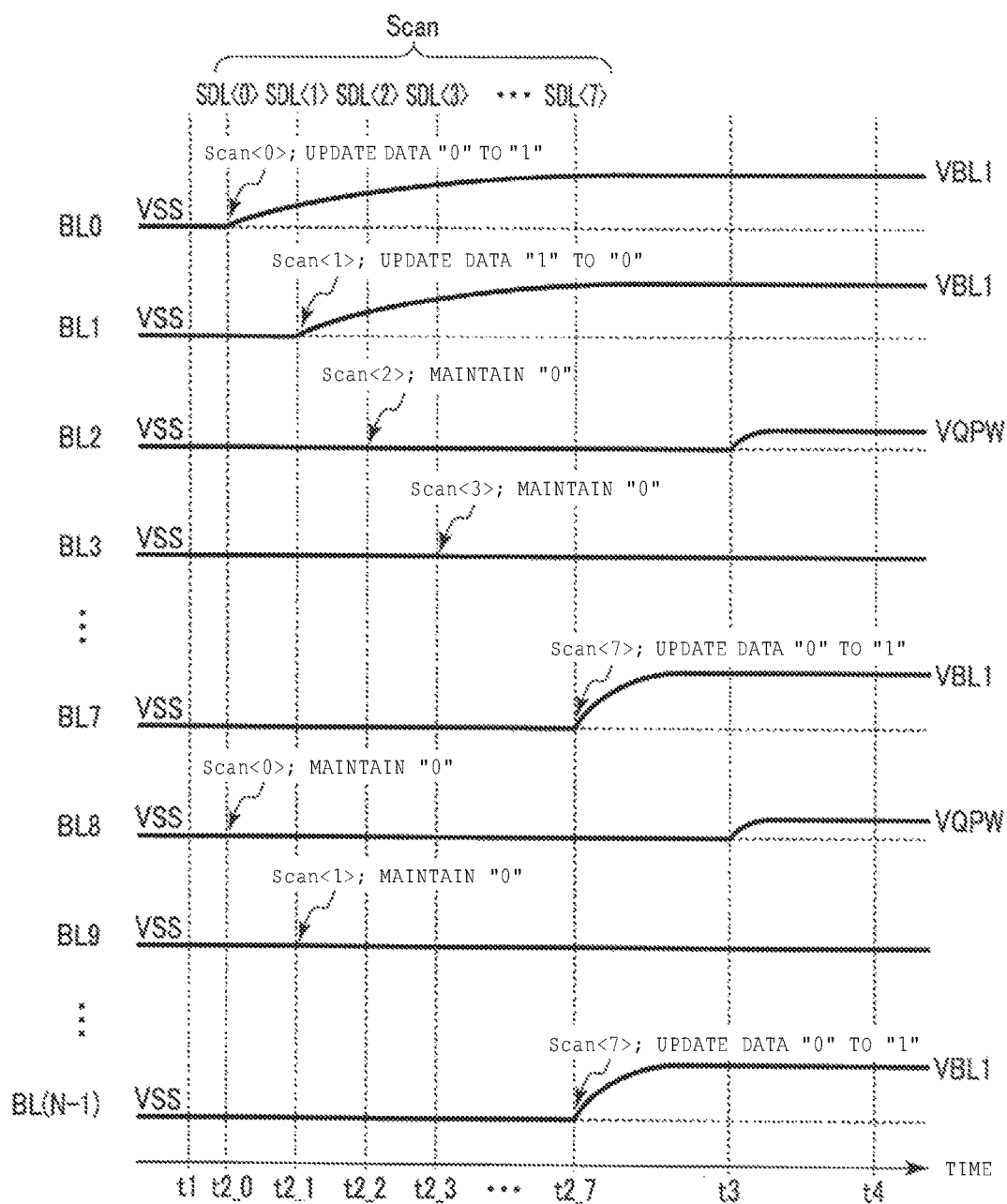
FIG. 25 is a timing chart illustrating an example of potentials of bit lines of the semiconductor memory device according to the fourth embodiment during a pre-charging operation.

4.5.2 With Regard to Specific Example of Fluctuation in Voltage of Bit Line by Scanning Next, a specific example of a fluctuation in a voltage of the bit line BL by scanning will be described with reference to FIG. 25. FIG. 25 illustrates voltages of the bit lines BL during the BL precharging in FIGS. 22 to 24.

As illustrated in FIG. 25, the sense amplifier 13 starts BL precharging at time t1. That is, the voltage VSS is applied to the bit lines BL.

At time t2_0, the control circuit 21 performs Scan<0>. As a result, the latch circuit SDL0 is updated from data of "0"

to data of "1", and the latch circuit SDL8 maintains data of "0". Accordingly, the sense amplifier unit SAU0 applies the voltage VBL1 to the bit line BL0, and the sense amplifier unit SAU8 subsequently applies the voltage VSS to the bit line BL8.

At time t2_1, the control circuit 21 performs Scan<1>. As a result, the latch circuit SDL1 is updated from data of "0" to data of "1", and the latch circuit SDL9 maintains data of "0". Accordingly, the sense amplifier unit SAU1 applies the voltage VBL1 to the bit line BL1, and the sense amplifier unit SAU9 subsequently applies the voltage VSS to the bit line BL9.

At time t2_2, the control circuit 21 performs Scan<2>. As a result, the latch circuit SDL2 maintains data of "0". Accordingly, the sense amplifier unit SAU2 subsequently applies the voltage VSS to the bit line BL2.

At time t2_3, the control circuit 21 performs Scan<3>. As a result, the latch circuit SDL3 maintains data of "0". Accordingly, the sense amplifier unit SAU3 subsequently applies the voltage VSS to the bit line BL3.

Similarly, the control circuit 21 performs Scan<4> to Scan<6>. Thereafter, the control circuit 21 performs Scan<7> at time t2_7. As a result, the latch circuits SDL7 and SDL (N−1) are updated from data of "0" to data of "1". Accordingly, the sense amplifier units SAU7 and SAU(N−1) apply the voltage VBL1 to the bit line BL7 and the bit line BL(N−1), respectively.

Therefore, the voltage VBL1 is applied to the bit lines BL0, BL2, BL7, BL9, and BL(N−1), and the voltage VSS is applied to the bit lines BL1, BL3, and BL8.

At time t3, BL("QPW") is started being charged with the voltage VQPW. Specifically, the latch circuits SDL3 and SDL8 are updated from data of "0" to data of "1". As a result, the sense amplifier units SAU3 and SAU8 apply the voltage VQPW to the bit lines BL3 and BL8.

At time t4, the BL precharging is terminated. For example, the row decoder 12 applies the voltage VPASS to selected and non-selected word lines WL of a selected string unit SU.

4.6 With Regard to Effects According to this Embodiment

With the configuration according to this embodiment, it is possible to obtain the same effects as those in the first to third embodiments.

Meanwhile, in this embodiment, data of "1" may be stored in all of the latch circuits SDL before BL precharging for programming is performed similar to the first embodiment, and charging of the bit line BL may not be performed similar to the third embodiment.

5. Modification Example and the Like

Each of the semiconductor memory device according to the above-described embodiments includes memory cells (MT in FIG. 1), bit lines (BL in FIG. 1) which are connected to the memory cells, and sense amplifiers (SAU in FIG. 3) which are connected to the bit lines and each of which includes a first latch circuit (SDL in FIG. 3). A write operation includes a programming loop in which programming and verification are repeated. The programming includes a first operation of performing charging and discharging (BL precharging) of the bit line based on data of the first latch circuit. The verification includes a second operation of updating the data of the first latch circuit based on a verification result. The first operation and the second operation are performed in parallel.

It is possible to provide the semiconductor memory devices capable of improving processing capability by applying the above-described embodiments. Meanwhile, the embodiments are not limited to the above-described configurations, and can be modified in various ways.

For example, in the above-described embodiments, a voltage sensing type sense amplifier may be used.

Further, in the above-described embodiments, a description is given of a case where inverted data of programming data is stored in the latch circuit ADL or the latch circuit BDL, but the programming data may be stored as it is. In this case, data of the latch circuit ADL is transmitted to the latch circuit SDL in scanning.

Further, in the above-described embodiments, scanning may include various computational processes performed by the sense amplifier unit SAU during BL precharging of programming. For example, when the sense amplifier unit SAU includes the latch circuits SDL, ADL, and BDL, a computational process using data of the latch circuits ADL and BDL may be included in scanning.

More specifically, for example, when the memory cell transistor MT can store data of a plurality of bits and a sense amplifier unit includes a plurality of latch circuits that store data of a plurality of bits, a computational process using data of the plurality of latch circuits may be included in scanning. In addition, scanning may include a computational process, for example, in a case where three or more programming conditions are applied in the fourth embodiment, a case where an application time of the voltage VPGM varies depending on the memory cell transistor MT, or a case where the voltage VQPW varies depending on the memory cell transistor MT.

Further, the above-described embodiments can also be applied to a three dimensional stacked NAND-type flash memory. Further, the above-described embodiments are not limited to a NAND-type flash memory, and can also be applied to a semiconductor memory device using a storage element capable of storing data.

Further, the term "connection" in the above-described embodiments also includes a state of indirect connection through something else, for example, a transistor or a resistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Meanwhile, in the embodiments regarding the exemplary embodiment, the following configuration may be adopted. For example, when threshold value levels in a case where the memory cell transistor MT can store data of 2 bits (four values) and stores any one of the four values are set to be an E level (erasing level), an A level, a B level, and a C level in ascending order, (1) In a read operation, a voltage applied to a word line selected for a read operation of the A level is in a range of, for example, from 0 V to 0.55 V. The voltage is not limited thereto, and may be set to be in any of ranges of from 0.1 V to 0.24 V, from 0.21 V to 0.31 V, from 0.31 V to 0.4 V, from 0.4 V to 0.5 V, and from 0.5 V to 0.55 V.

A voltage applied to a word line selected for a read operation of the B level is in a range of, for example, from 1.5 V to 2.3 V. The voltage is not limited thereto, and may be set to be in any of ranges of from 1.65 V to 1.8 V, from 1.8 V to 1.95 V, from 1.95 V to 2.1 V, and from 2.1 V to 2.3 V.

A voltage applied to a word line selected for a read operation of the C level is in a range of, for example, from 3.0 V to 4.0 V. The voltage is not limited thereto, and may be set to be in any of ranges of from 3.0 V to 3.2 V, from 3.2 V to 3.4 V, from 3.4 V to 3.5 V, from 3.5 V to 3.6 V, and from 3.6 V to 4.0 V.

A time (tR) of a read operation may be set to be in any of ranges of, for example, from 25 µs to 38 µs, from 38 µs to 70 µs, and from 70 µs to 80 µs.

(2) A write operation includes programming and a verification operation as described above. In the write operation, a voltage which is first applied to a word line selected during the programming is in a range of, for example, from 13.7 V to 14.3 V. The voltage is not limited thereto, and may be set to be in any of ranges of, for example, from 13.7 V to 14.0 V and from 14.0 V to 14.6 V.

A voltage which is first applied to a selected word line during the writing of an odd-numbered word line and a voltage which is first applied to a selected word line during the writing of an even-numbered word line may be changed.

When the programming is performed based on an incremental step pulse program (ISPP) system, a voltage of, for example, approximately 0.5 V is used as a step-up voltage.

A voltage applied to a non-selection word line may be in a range of, for example, from 6.0 V to 7.3 V. The voltage is not limited to this case, and may be in a range of, for example, from 7.3 V to 8.4 V or may be set to equal to or less than 6.0 V.

A bus voltage applied depending on whether a non-selection word line is an odd-numbered word line or an even-numbered word line may be changed.

A time (tProg) of the write operation may be set to be in any of ranges, for example, from 1,700 µs to 1,800 µs, from 1,800 µs to 1,900 µs, and from 1,900 µs to 2,000 µs.

(3) In an erasing operation, a voltage which is first applied to a well, which is formed on a semiconductor substrate and has a memory cell arranged thereon is in a range of, for example, from 12 V to 13.6 V. The voltage is not limited to this case, and may be in any of ranges of, for example, from 13.6 V to 14.8 V, from 14.8 V to 19.0 V, from 19.0 to 19.8 V, and from 19.8 V to 21 V.

A time (tErase) of the erasing operation may be set to be in any of ranges of, for example, from 3,000 µs to 4,000 µs, from 4,000 µs to 5,000 µs, and from 4,000 µs to 9,000 µs.

(4) The structure of the memory cell includes a charge storage layer which is arranged on a semiconductor substrate (silicon substrate) through a tunnel insulating film having a film thickness of from 4 nm to 10 nm. The charge storage layer may be configured as a stacked structure of an insulating film, formed of SiN or SiON to have a film thickness of from 2 nm to 3 nm, and polysilicon having a film thickness of from 3 nm to 8 nm. In addition, a metal such as Ru may be added to polysilicon. An insulating film is provided on the charge storage layer. For example, the insulating film is configured such that a silicon oxide film having a film thickness of from 4 nm to 10 nm is interposed between a lower High-k film having a film thickness of from 3 nm to 10 nm and an upper High-k film having a film thickness of from 3 nm to 10 nm. The High-k film may be formed of HfO or the like. In addition, the film thickness of the silicon oxide film may be larger than the film thickness of the High-k film. A control electrode having a film thickness of from 30 nm to 70 nm is formed on the insulating film through a material having a film thickness of from 3 nm to 10 nm. Here, such a material is a metal oxide film such as TaO, or a metal nitride film such as TaN. A material of the control electrode may be W or the like.

In addition, an air gap can be formed between memory cells.

What is claimed is:

1. A semiconductor memory device comprising:
a memory cell;
a bit line electrically connected to the memory cell;
a sense amplifier electrically connected to the bit line and including a first latch; and
a controller configured to execute a write operation on the memory cell, the write operation including a first program operation followed by a verify operation that includes a step of updating data of the first latch and a second program operation that includes a step of pre-charging the bit line, wherein
the step of pre-charging the bit line is initiated prior to the data of the first latch is updated,
wherein during the step of pre-charging, the bit line is charged to a first voltage if the updated data of the first latch is a first value and is discharged if the updated data of the first latch is a second value.

2. The device according to claim 1, wherein the controller updates the data of the first latch based on a result of the verify operation.

3. The device according to claim 2, wherein the updated data of the first latch is the first value when the result of the verify operation is a fail and the second value when the result of the verify operation is a pass.

4. The device according to claim 1, wherein
prior to the step of pre-charging, the bit line is discharged.

5. The device according to claim 1, wherein
prior to the step of pre-charging, the bit line is not discharged and maintained at a voltage level higher than a ground voltage.

6. A semiconductor memory device comprising:
a plurality of memory cells;
a plurality of bit lines, each electrically connected to one of the memory cells;
a sense amplifier electrically connected to the bit lines and including a first latch; and
a controller configured to execute a write operation on the memory cells, the write operation including a first program operation followed by a verify operation that includes a step of updating data of the first latch and a second program operation that includes a step of pre-charging the bit lines based on updated data of the first latch, wherein
the step of pre-charging the bit lines is carried out in parallel with the step of updating the data of the first latch, and
the first latch stores data for each of the bit lines, including first data for a first bit line and second data for a second bit line, and the first bit line is pre-charged to a first voltage when the first data as updated is a first value and the second bit line is pre-charged to the first voltage when the second data as updated is a first value.

7. The device according to claim 6, wherein the step of pre-charging the bit lines is initiated prior to any of the data of the first latch is updated.

8. The device according to claim 6, wherein the pre-charging of the first bit line is initiated prior to the pre-charging of the second bit line.

9. The device according to claim 6, wherein the controller updates the data of the first latch based on a result of the verify operation.

10. The device according to claim 6, wherein
prior to the step of pre-charging, the bit line is discharged.

11. The device according to claim 6, wherein
prior to the step of pre-charging, the bit line is not discharged and maintained at a voltage level higher than a ground voltage.

12. A semiconductor memory device comprising:
a plurality of memory cells;
a plurality of bit lines, each electrically connected to one of the memory cells;
a sense amplifier electrically connected to the bit lines and including a first latch and a second latch; and
a controller configured to execute a write operation on the memory cells, the write operation including a first program operation followed by a verify operation that includes a step of updating data of the first and second latches and a second program operation that includes a step of pre-charging the bit lines based on updated data of the first and second latches, wherein
the step of pre-charging the bit lines is carried out in parallel with the step of updating the data of the first and second latches, and
each of the first program operation and the second program operation is carried out under a first programming condition and a second programming condition, and the verify operation includes a first verification that is carried out with a first read voltage and a second verification that is carried out with a second read voltage that is higher than the first read voltage.

13. The device according to claim 12, wherein a first bit line electrically connected to a memory cell that is to be programmed under the first program condition is charged to a first voltage and a second bit line electrically connected to a memory cell that is to be programmed under the second program condition is charged to a second voltage that is higher than the first voltage.

14. The device according to claim 12, wherein
the step of pre-charging the bit lines is initiated after the first verification and before completion of the second verification.

15. The device according to claim 14, wherein
the first latch stores data for each of the bit lines, including first data for a first bit line and second data for a second bit line, and
the first bit line is pre-charged to a first voltage when the first data as updated is a first value and the second bit line is pre-charged to the first voltage when the second data as updated is a first value.

16. The device according to claim 15, wherein the pre-charging of the first bit line is initiated prior to the pre-charging of the second bit line.

17. The device according to claim 12, wherein the controller updates the data of the first and second latches based on results of the first verification and the second verification.

* * * * *